(12) United States Patent
Tadokoro et al.

(10) Patent No.: US 8,927,906 B2
(45) Date of Patent: Jan. 6, 2015

(54) HEATING DEVICE, COATING/DEVELOPING SYSTEM, HEATING METHOD, COATING/DEVELOPING METHOD, AND RECORDING MEDIUM HAVING PROGRAM FOR EXECUTING HEATING METHOD OR COATING/DEVELOPING METHOD

(75) Inventors: Masahide Tadokoro, Kumamoto (JP); Yoshihiro Kondo, Kumamoto (JP); Takashi Saito, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 880 days.

(21) Appl. No.: 13/018,877

(22) Filed: Feb. 1, 2011

(65) Prior Publication Data
US 2011/0189602 A1 Aug. 4, 2011

(30) Foreign Application Priority Data
Feb. 4, 2010 (JP) ................................ 2010-023088

(51) Int. Cl.
| H05B 11/00 | (2006.01) |
| B05C 21/00 | (2006.01) |
| G03F 7/20 | (2006.01) |
| H05B 3/20 | (2006.01) |

(52) U.S. Cl.
CPC . *B05C 21/00* (2013.01); *G03F 7/20* (2013.01); *H05B 3/20* (2013.01)
USPC ....................................... 219/220; 219/444.1

(58) Field of Classification Search
USPC .................... 219/220, 444.1, 448.12; 430/30; 396/611; 700/121
See application file for complete search history.

(56) References Cited

U.S. PATENT DOCUMENTS

| 7,902,485 B2 * | 3/2011 | Jyousaka et al. ............... 219/494 |
| 7,957,828 B2 * | 6/2011 | Tadokoro et al. ............. 700/121 |
| 7,968,260 B2 * | 6/2011 | Tadokoro et al. ............... 430/30 |
| 7,968,825 B2 * | 6/2011 | Jyousaka et al. ......... 219/448.12 |

(Continued)

FOREIGN PATENT DOCUMENTS

| JP | 11-283896 A | 10/1999 |
| JP | 1999-283896 A | 10/1999 |

(Continued)

OTHER PUBLICATIONS

An Office Action dated Oct. 26, 2011, issued from the Japanese Patent Office (JPO) of Japanese Patent Application No. 2010-023088 and a partial EN translation thereof.

(Continued)

*Primary Examiner* — Stewart Fraser
(74) *Attorney, Agent, or Firm* — Abelman, Frayne & Schwab

(57) ABSTRACT

The disclosed heating device is to perform a heating process on an exposed substrate formed with a resist film before a developing process, the device including a heating part to perform a heating process on the exposed substrate, the heating part including a plurality of two-dimensionally arranged heating elements; a seating part provided at an upper side of the heating part, on which the substrate is disposed; and a control part to correct a setting temperature of the heating part based on temperature correction values, and to control the heating part based on the corrected setting temperature, during the heating process on one substrate by the heating part, wherein the temperature correction values being previously obtained from measured critical dimensions of the resist pattern in another substrate formed with the resist pattern through the heating process by the heating part and then the developing process.

22 Claims, 16 Drawing Sheets

(56) References Cited

U.S. PATENT DOCUMENTS

| | | | |
|---|---|---|---|
| 7,985,516 B2* | 7/2011 | Ogata et al. | 430/30 |
| 2006/0198633 A1* | 9/2006 | Tanaka et al. | 396/611 |
| 2008/0105669 A1* | 5/2008 | Jyousaka et al. | 219/448.12 |
| 2008/0257495 A1* | 10/2008 | Tadokoro et al. | 156/345.27 |
| 2009/0008381 A1* | 1/2009 | Jyousaka et al. | 219/494 |
| 2009/0078695 A1* | 3/2009 | Jyousaka et al. | 219/494 |
| 2009/0254226 A1* | 10/2009 | Iwanaga et al. | 700/300 |
| 2009/0269686 A1* | 10/2009 | Ogata et al. | 430/30 |

FOREIGN PATENT DOCUMENTS

| | | | |
|---|---|---|---|
| JP | 2003-100605 A | 4/2003 | |
| JP | 2006-059931 A | 3/2006 | |
| JP | 2008-84886 A | 4/2008 | |
| JP | 2010-003905 A | 1/2010 | |

OTHER PUBLICATIONS

An Office Action dated Apr. 25, 2012, issued from the Japanese Patent Office (JPO) of Japanese Patent Application No. 2010-023088 and a partial EN translation thereof.

* cited by examiner (a)

(b)

(a)

(b)

HEATING DEVICE, COATING/DEVELOPING SYSTEM, HEATING METHOD, COATING/DEVELOPING METHOD, AND RECORDING MEDIUM HAVING PROGRAM FOR EXECUTING HEATING METHOD OR COATING/DEVELOPING METHOD

This application is based on and claims priority from Japanese Patent Application No. JP2010-023088 filed on Feb. 4, 2010, with the Japanese Patent Office, the disclosure of which is incorporated herein in its entirety by reference.

TECHNICAL FIELD

The present disclosure relates to a heating device for performing a heating process on a substrate, and a coating/developing system having the heating device. Also, the present disclosure relates to a heating method in the heating device, a coating/developing method for coating/developing a substrate by the heating method, and a recording medium in which a program for executing the heating method or the coating/developing method is recorded.

BACKGROUND

In fabrication of a semiconductor device, a photolithography process is used to form a predetermined resist pattern on a substrate such as a semiconductor wafer ("wafer"). In the photolithography process, for example, a plurality of processes, such as a coating process, an exposure process, a heating process, and a developing process, are sequentially performed to form the resist pattern. In the coating process, a resist liquid is coated on the wafer to form a resist film. In the exposure process, the resist film is exposed in a predetermined pattern. In the heating process (post-exposure baking), a chemical reaction within the exposed resist film is facilitated after the exposure process. In the developing process, the exposed resist film is developed. A series of processes as described above are performed by a coating/developing system mounted with various process devices such as a coating device, a heating device, and a developing device, and a wafer carrying device, etc. Also, in such a coating/developing system, for example, a plurality of wafers to be processed with the same recipe are sequentially carried and processed.

In such a coating/developing system, a series of processes described above have to be performed while maintaining a predetermined level. For this reason, after the series of processes are performed, the distribution of estimation parameters, such as critical dimensions (CDs) of a resist pattern, has to be obtained within a wafer plane. In the coating/developing system, this distribution is obtained for example by processing a test wafer, and measuring the estimation parameters at a plurality of estimation points within a plane of the test wafer by a measuring device mounted in the system before processing of product wafers. See, for example, Japanese Laid-Open Patent Publication No. 2008-84886.

For example, in a heating device included in a coating/developing system, a heating plate is divided into a plurality of divisions in order to reduce the temperature fluctuation within a plane of a wafer. Then, by changing the setting temperature of each of the plurality of divisions, a heating process for facilitating a chemical reaction within an exposed resist film is controlled in such a manner that the heating process can be uniformly performed within a wafer plane. In the example described in Japanese Laid-Open Patent Publication No. 2008-84886, a control process is performed in such a manner that the CDs of a resist pattern are measured at a plurality of measurement points within a wafer plane, the distribution of the CDs within the wafer plane is obtained, and the setting temperature of a heating plate is corrected.

SUMMARY

According to one embodiment, there is provided a heating device comprising a heating part including a plurality of two-dimensionally arranged heating elements configured to perform a heating process on an exposed substrate prior to a developing process to form a resist pattern on the exposed substrate using a resist film, a placement part provided at an upper side of the heating part and configured to place the exposed substrate, and a control part configured to correct a setting temperature of the heating part based on a temperature correction value, and to control the heating part based on the corrected setting temperature, during a heating process of the exposed substrate by the heating part. In particular, the temperature correction value is obtained from a measured line width of a resist pattern formed on a substrate separately processed in advance from the exposed substrate through a heating process by the heating part and a subsequent developing process.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
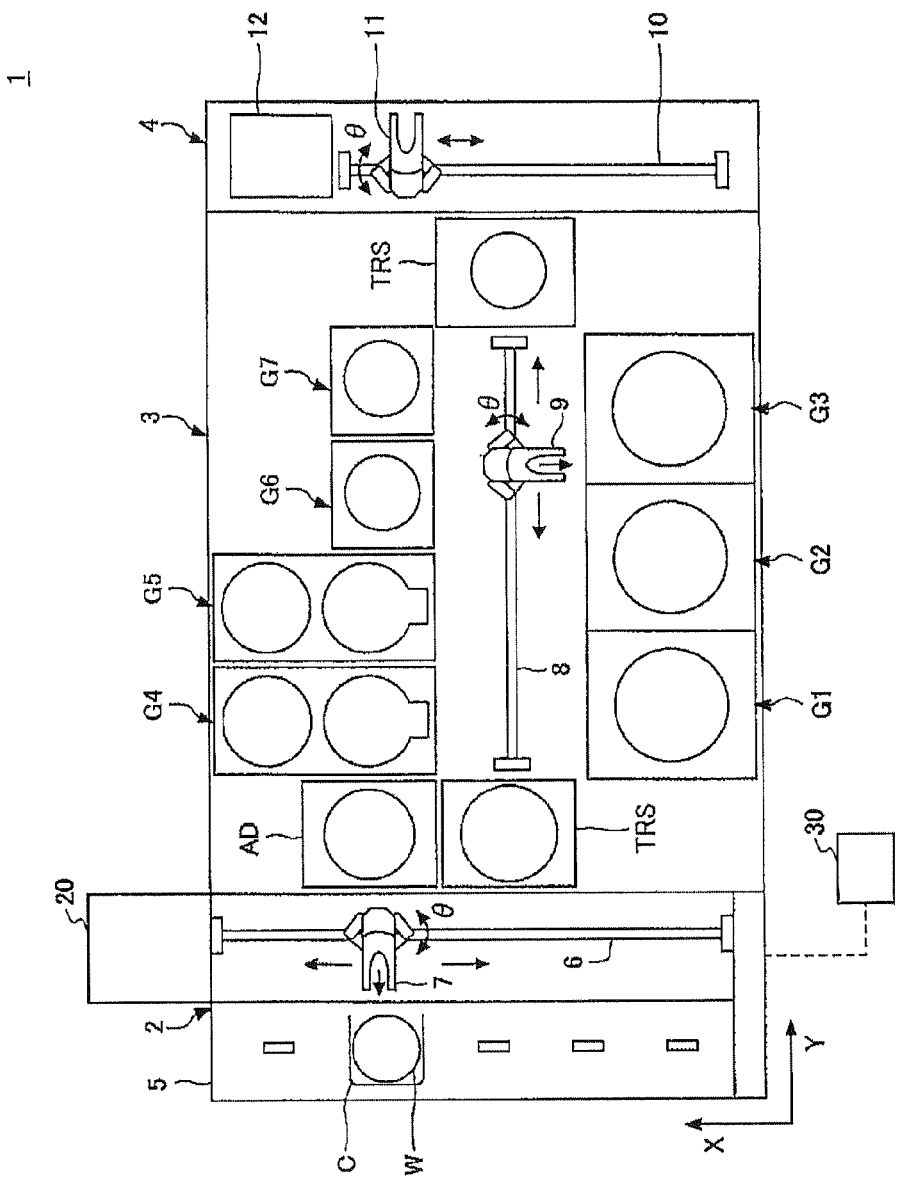
FIG. 1 is a plan view schematically illustrating the configuration of a coating and developing system according to a first embodiment.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

However, in the heating device of the above described coating/developing system, the control through correction of a setting temperature of a heating plate has problems described below.

In the heating device, the heating plate is divided into a plurality of divisions. For the heating control of a heater provided in each of the divisions, the setting temperature is corrected. For example, in a case where a heater including a heating element, such as a resistor, is provided on the heating plate, the heater heats the heating plate by heat conduction, and then the heated heating plate heats a disposed wafer by the heat conduction. Accordingly, even within the same division a wafer temperature varies by a variety of distances from the heater. Thus, although the temperature distribution is corrected based on the above mentioned distribution of critical dimensions (CDs), it may be difficult to reduce the variation of CDs.

Also, in a case where the heater is provided in the heating plate, the heating plate has to be always heated by the heater so as to stabilize the temperature of the heating plate. Thus, it may be difficult to reduce the power consumed by the heating device.

The present disclosure has been made in consideration of these problems, and provides a heating device for performing a heating process on a substrate, and a heating method in the heating device, which can reduce the variation of the critical dimensions within a plane of a wafer, and reduce the power consumption.

In order to solve the above described problems, respective means are provided as described below in the present disclosure.

According to an embodiment, there is provided a heating device comprising a heating part including a plurality of two-dimensionally arranged heating elements configured to perform a heating process on an exposed substrate prior to a developing process to form a resist pattern on the exposed substrate using a resist film, a placement part provided at an upper side of the heating part and configured to place the exposed substrate, and a control part configured to correct a setting temperature of the heating part based on a temperature correction value, and to control the heating part based on the corrected setting temperature, during a heating process of the exposed substrate by the heating part. In particular, the temperature correction value is obtained from a measured critical dimension of a resist pattern formed on a substrate separately processed in advance from the exposed substrate through a heating process by the heating part and a subsequent developing process.

The heating elements are light emitting devices emitting infrared rays, and the control part controls an amount of light arriving at the exposed substrate from each of the light emitting devices, and the light emitting devices are light emitting diodes. Also, the heating part includes a plurality of liquid crystal devices arranged two dimensionally between the plurality of light emitting devices and the exposed substrate to transmit or block the infrared rays emitted from the light emitting devices, and the control part controls a transmission ratio of the infrared rays at each of the liquid crystal devices during the heating process on the exposed substrate.

The placement part includes a plurality of protrusions provided at an upper side of the heating part, the protrusions being configured to separately support the exposed substrate while keeping the exposed substrate with a predetermined distance from the upper side of the heating part. The heating device further comprises a temperature sensor, provided in the plurality of protrusions configured to measure a temperature of the exposed substrate, and a cooling part, provided at a lower side of the heating part, configured to cool the exposed substrate or the heating part.

In the heating device as described above, a plurality of chips are arranged on the exposed substrate, and an arrangement interval of the plurality of heating elements is smaller than an arrangement interval of the plurality of chips.

According to another embodiment, there is provided a coating and developing system comprising a coating device configured to coat a resist film on a substrate, an exposure device configured to expose the substrate coated with the resist film, a developing device configured to develop the resist film on the substrate to form a resist pattern after exposing the resist film. In particular, the coating and developing system further comprises the heating device as described above, and a critical dimension measuring device configured to measure the critical dimension of the resist pattern formed on the substrate separately processed in advance from the exposed substrate.

In the coating and developing system described above, a plurality of chips are arranged on the exposed substrate, and the coating and developing system further comprises an alignment device, configured to align the exposed substrate in such a manner that an arrangement direction of the plurality of chips, and an arrangement direction of the plurality of heating elements are approximately parallel with each other during disposition of the exposed substrate on the placement part.

According to yet another embodiment, there is provided a heating method comprising steps of coating a resist film on a substrate, exposing the resist film on the substrate, heating the exposed substrate with a heating device which includes a heating part having a plurality of two-dimensionally arranged heating elements, and a placement part provided at an upper side of the heating part and configured to place the exposed substrate, correcting a setting temperature of the heating part based on a temperature correction value, and controlling the heating part based on the corrected setting temperature, and developing the resist film on the substrate heated at the heating step. In particular, the temperature correction value is obtained from measured critical dimension of a resist pattern formed on a substrate separately processed in advance from the exposed substrate through a heating process by the heating part and a subsequent developing process.

In the heating method as described above, the heating elements are light emitting devices emitting infrared rays, and the controlling step controls an amount of light arriving at the exposed substrate from each of the light emitting devices. The light emitting devices are light emitting diodes. In particular, the heating part includes a plurality of liquid crystal devices arranged two dimensionally between the plurality of light emitting devices and the exposed substrate to transmit or block the infrared rays emitted from the light emitting devices, and the controlling steps controls a transmission ratio of the infrared rays at each of the liquid crystal devices.

In the heating method as described above, the placement part includes a plurality of protrusions provided at an upper side of the heating part, the protrusions being configured to separately support the exposed substrate while keeping the exposed substrate with a predetermined distance from the upper side of the heating part. The heating device further includes a temperature sensor, provided in the plurality of protrusions configured to measure a temperature of the exposed substrate. Also, the heating device further includes a cooling part provided at a lower side of the heating part configured to cool the exposed substrate or the heating part, and a plurality of chips are arranged on the exposed substrate, and the controlling step controls an arrangement interval of the plurality of heating elements to be smaller than an arrangement interval of the plurality of chips.

According to yet another embodiment, there is provided a coating and developing method comprising steps of heating an exposed substrate according to the heating method as described above, and measuring the critical dimension of the resist pattern formed on the substrate separately processed in advance from the exposed substrate. In the coating and developing method, a plurality of chips are arranged on the exposed substrate, and the coating/developing method further comprises aligning the exposed substrate in such a manner that an arrangement direction of the plurality of chips, and an arrangement direction of the plurality of heating elements are approximately parallel with each other during disposition of the exposed substrate on a placement part.

According to yet another embodiment, there is provided a computer-readable recording medium storing a computer executable program that, when executed, causes a computer to perform the heating method. There is also provided a computer-readable recording medium storing a computer executable program that, when executed, causes a computer to perform the coating and developing method as described above.

According to the heating device for performing a heating process on a substrate, and the heating method in the heating device of the present disclosure, it is possible to reduce a variation of critical dimensions within a plane of a wafer, and to reduce the power consumption.

Hereinafter, embodiments of the present disclosure will be described with reference to drawings.

First Embodiment

First, with reference to FIGS. 1 to 8, a heating device, a coating/developing system including the heating device, a heating method in the heating device, and a coating/developing method in the coating/developing system will be described, according to a first embodiment.

First of all, according to the present embodiment, a resist coating/developing system, and a coating/developing method in the coating/developing system will be described.

Figure 2:
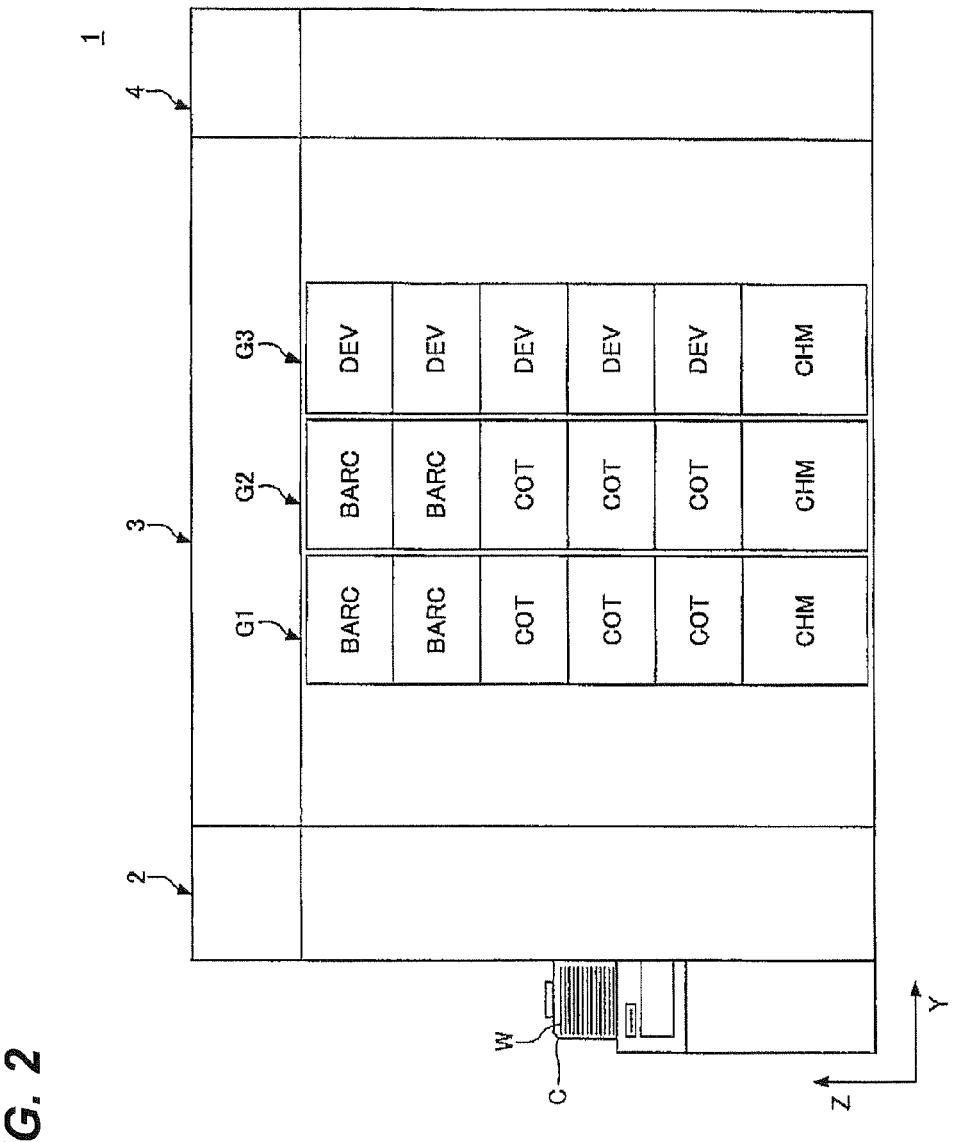
FIG. 2 is a front view schematically illustrating the configuration of a coating and developing system according to a first embodiment.
Figure 3:
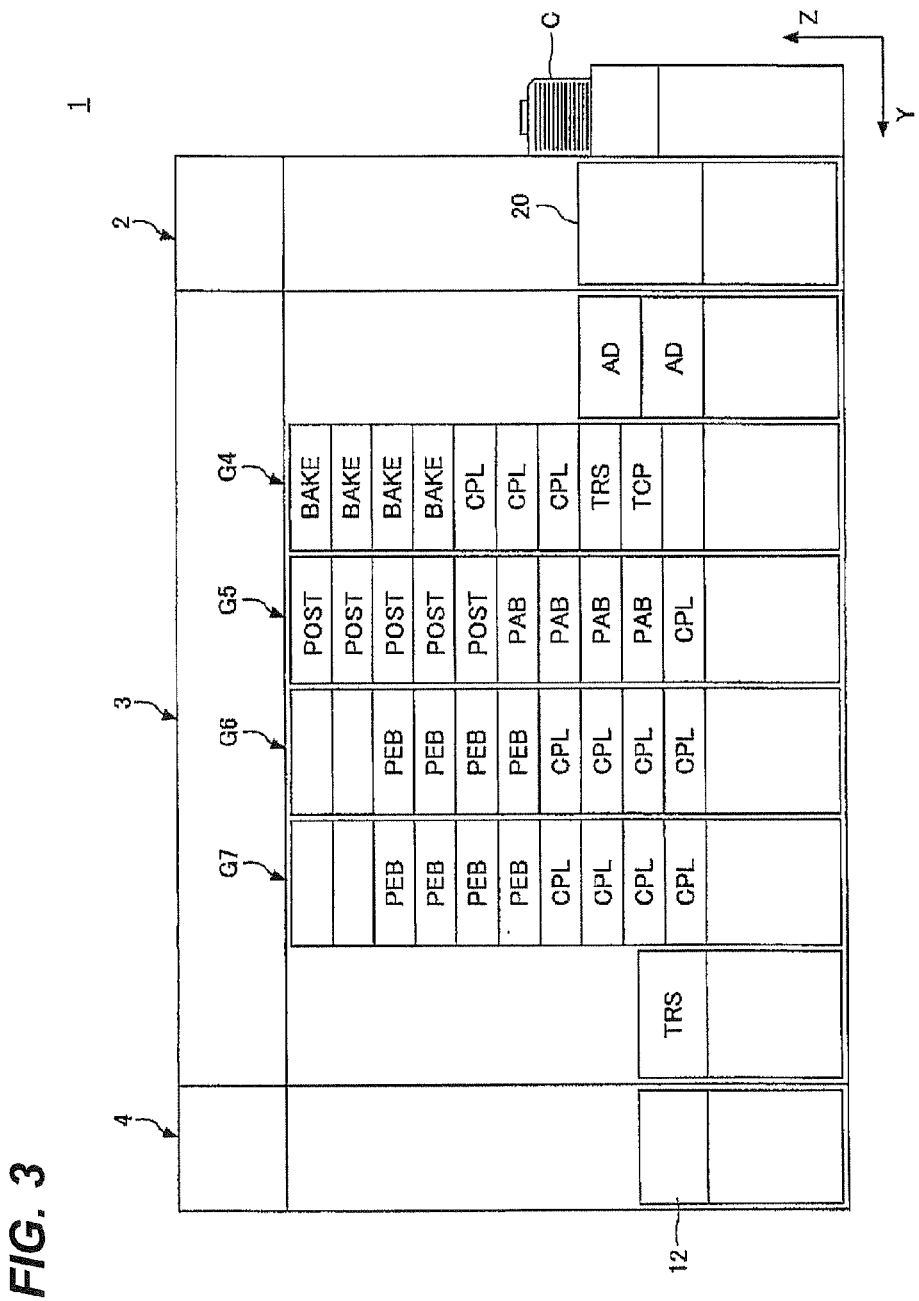
FIG. 3 is a rear view schematically illustrating the configuration of a coating/developing system according to a first embodiment.

FIG. 1 is a plan view schematically illustrating the configuration of a coating/developing system according to the present embodiment. FIG. 2 is a front view illustrating the coating/developing system, and FIG. 3 is a rear view illustrating the coating/developing system.

As shown in FIG. 1, a coating/developing system 1 has a configuration in which a cassette station 2, a processing station 3, and an interface station 4 are integratedly connected. Coating/developing system 1 coats a resist on a wafer W, and then conducting a heating process for wafer W having the resist coated thereon, thereby forming a resist film on wafer W. Also, coating/developing system 1 exposes wafer W formed with the resist film, which is followed by a developing process, so as to form a resist pattern on wafer W.

Cassette station 2 loads/unloads, for example, 25 wafers W in a cassette unit to coating/developing system 1 or to a cassette C, from the outside. Processing station 3 is provided adjacently to cassette station 2, in which various processing devices are disposed in multi stages to perform processing of single-wafer type during photolithography process. Interface station 4 is provided adjacently to processing station 3, and transfers wafers W to/from an exposure device (not shown).

In cassette station 2, a cassette seating unit 5 is provided. Cassette seating unit 5 is designed to allow a plurality of cassettes C to be disposed in a row in an X direction (in the upward and downward direction in FIG. 1). In cassette station 2, a wafer carrier 7 is provided which can move in the X direction on a transfer path 6. Wafer carrier 7 can move in the arrangement direction (a Z direction; a vertical direction) of wafers W received in cassette C, and can selectively access wafers W within respective cassettes C arranged in the X direction.

Wafer carrier 7 can rotate around the θ direction of Z axis, and can access a critical dimension measuring device 20. Wafer carrier 7 can also access a transition device TRS and an adhesion device AD in the processing station 3 side, which will be described below.

Processing station 3 includes, for example, 7 processing device groups G1 to G7 in which a plurality of process devices are disposed in multi stages. At the −X direction side (the downward direction in FIG. 1) of processing station 3, a first process device group G1, a second process device group G2, and a third process device group G3 are sequentially disposed from cassette station 2's side. At the X direction side of (the upward direction in FIG. 1) processing station 3, a fourth process device group G4, a fifth process device group G5, a sixth process device group G6, and a seventh process device group G7 are sequentially disposed from the side of cassette station 2.

Between first to third process device groups G1 to G3, and fourth to seventh process device groups G4 to G7, a first carrying device 9 is provided which can move on a transfer path 8 in the Y direction. First carrying device 9 can rotate around the θ direction of Z axis, and can selectively access respective process devices within first to seventh process device groups G1 to G7 to carry wafers W.

As shown in FIG. 2, in first process device group G1 and second process device group G2, liquid process devices such as a resist coating device COT and a bottom anti-reflective coating device BARC are sequentially piled up one another from the bottom in 5 stages, for performing a liquid process on wafer W by supplying a predetermined liquid to wafer W. Resist coating device COT coats a liquid resist to wafer W. Bottom anti-reflective coating device BARC forms an anti-reflective film which can inhibit reflection of light during an exposure process. In third process device group G3, liquid process devices such as developing devices DEV for developing wafer W by supplying a developer to wafer W are sequentially piled up one another from the bottom in 5 stages. Also, at the lowermost portion of each of first to third process device groups G1 to G3, a chemical chamber CHM is provided for supplying various kinds of processing liquids to liquid process devices within each of process device groups G1 to G3.

As shown in FIG. 3, in fourth process device group G4, a temperature control device TCP, a transition device TRS, high-precision temperature control devices CPL, and high temperature heating devices BAKE are sequentially piled up one another from the bottom in 9 stages. Transition device TRS transfers wafer W. High-precision temperature control device CPL controls the temperature of wafer W under a high-precision temperature control. High temperature heating device BAKE heats wafer W at a high temperature.

In fifth process device group G5, for example, high-precision temperature control device CPL, pre-baking devices PAB, and post-baking devices POST are sequentially piled up one another from the bottom in 10 stages. Pre-baking device PAB heats wafers W coated with resist. Post-baking device POST heats developed wafers W.

In sixth process device group G6 and seventh process device group G7, a plurality of heating devices such as high-precision temperature control devices CPL, and post-exposure baking devices PEB are sequentially piled up one another from the bottom in 8 stages for performing a heating process on wafer W. Post-exposure baking device PEB heats wafer W which has been exposed and has not yet been developed.

As shown in FIG. 1, at the cassette station 2's side of processing station 3, transition device TRS is provided which is for transferring wafer W between wafer carrier 7 and first carrying device 9. Also, a plurality of process devices are disposed at the X direction side of transition device TRS. For example, as shown in FIG. 3, adhesion devices AD for hydrophobizing wafer W are sequentially piled up one another from the bottom in 2 stages.

As shown in FIG. 1, at interface station 4's side of processing station 3, a transition device TRS is provided which is for transferring wafer W between first carrying device 9, and a wafer carrier 11 (which will be described below). Also, at the X direction side of transition device TRS, for example, a peripheral exposure device WEE (not shown) is disposed which is for selectively exposing the edge portion of wafer W.

In interface station 4, for example, as shown in FIG. 1, wafer carrier 11 moving on a transfer path 10 extending in the X direction, and a buffer cassette 12 are provided. Wafer carrier 11 can move an up and down direction, and can rotate in the θ direction, and also can access an exposure device (not shown) adjacent to interface station 4, and buffer cassette 12, thereby carrying wafer W.

Also, as shown in FIG. 1, for example, in cassette station 2, a critical dimension measuring device 20 for measuring critical dimensions (CDs) of a resist pattern on wafer W is provided.

A main body controlling unit 30 controls the wafer processing performed by coating/developing system 1. Main body controlling unit 30 also controls critical dimension measuring device 20 in measuring the CDs of the resist pattern formed on wafer W. Main body controlling unit 30, for example, may be included in a general-purpose computer provided with a CPU, a memory device, or the like. Also, main body controlling unit 30 can control wafer processing or CD measurement by executing a program recorded in the memory device through the CPU. Also, the program may be installed in main body controlling unit 30 by a computer-readable recording medium.

The wafer processing and the CD measurement, as described above are included in a coating/developing method performed by coating/developing system 1. In other words, in the coating/developing method, resist is coated on wafer W, and then wafer W coated with resist is heated so as to form a resist film on wafer W. Also, in the coating/developing method, wafer W formed with the resist film is exposed and developed so as to form a resist pattern on wafer W. Also, the coating/developing method includes a heating step for performing a heating process on wafer W by post-exposure baking device PEB, and a CD measuring step for measuring CDs of the resist pattern formed on wafer W by critical dimension measuring device 20.

In coating/developing system 1 constructed as described above, a coating/developing process of wafer W is performed as follows. First of all, by wafer carrier 7 shown in FIG. 1, a plurality of product wafers Wn (n indicates a natural number of 1 or more) with the same recipe are taken out one by one from cassette C on cassette seating unit 5, and are sequentially carried to temperature control device TCP included in fourth process device group G4 of processing station 3. The temperature of wafers Wn carried to temperature control device TCP is adjusted to a predetermined temperature. Then, wafers Wn are sequentially carried to bottom anti-reflective coating device BARC by first carrying device 9, and an anti-reflective coating liquid is coated on wafers Wn. Wafers Wn coated with the anti-reflective coating liquid are sequentially carried to high temperature heating device BAKE and high-precision temperature control device CPL by first carrying device 9, and then formed with an anti-reflective film by the performance of predetermined processing in each of the devices. Wafers Wn formed with the anti-reflective film are sequentially carried to resist coating device COT, and then resist is coated on wafers Wn. Wafers Wn coated with resist are sequentially carried to pre-baking device PAB by first carrying device 9, and are subjected to pre-baking. Wafers Wn which have been subjected to pre-baking are sequentially carried to peripheral exposure device WEE (not shown) and high-precision temperature control device CPL by first carrying device 9, and formed with a resist film by the performance of predetermined processing in each of the devices. Wafers Wn formed with the resist film are transferred to transition device TRS by first carrying device 9. Wafers Wn transferred to transition device TRS are sequentially carried to an exposure device (not shown) by wafer carrier 11 of interface station 4, and then exposed.

Wafers Wn which have been exposed are transferred again to transition device TRS by wafer carrier 11. Wafers Wn transferred to transition device TRS are sequentially carried to, for example, post-exposure baking device PEB by first carrying device 9, and are subjected to a post-exposure baking. Wafers Wn which have been subjected to the post-exposure baking are sequentially carried to high-precision temperature control device CPL by first carrying device 9, and then the temperature of wafers Wn is controlled. Then, wafers Wn are carried to developing device DEV, and then the resist film formed and exposed on wafers Wn is developed. Then, wafers Wn are sequentially carried to post-baking device POST by first carrying device 9, and are subjected to the post-baking. Then, wafers Wn are sequentially carried to high-precision temperature control device CPL, and the temperature of wafers Wn is controlled. Then, wafers Wn are sequentially carried to transition device TRS by first carrying device 9, and returned to cassette C by wafer carrier 7. Thus, a series of wafer processing are ended.

Hereinafter, with reference to FIGS. 4 and 5, post-exposure baking device PEB will be described. Also, post-exposure baking device PEB corresponds to a heating device of the present disclosure.

Figure 4:
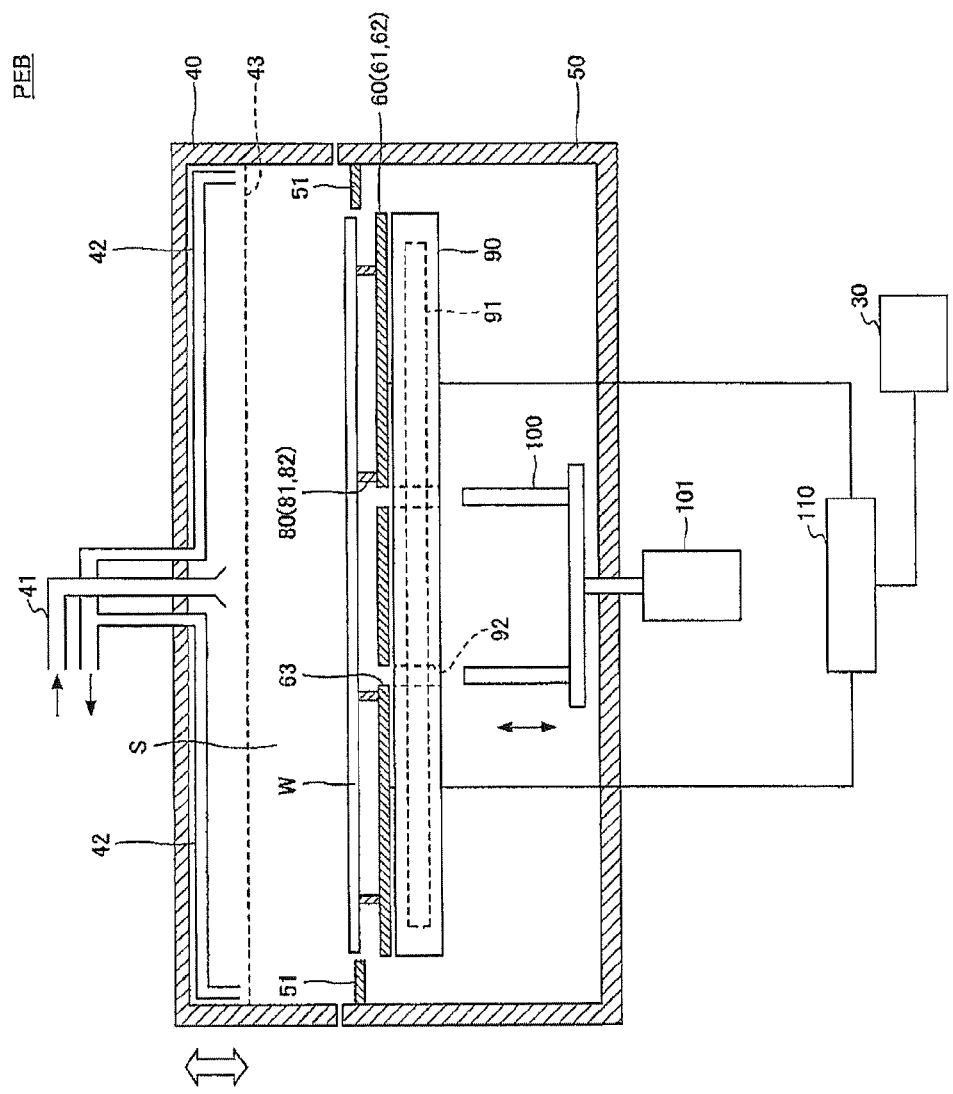
FIG. 4 is a schematic front view illustrating a post-exposure baking device according to a first embodiment.

FIG. 4 is a schematic front view illustrating a post-exposure baking device according to the present embodiment. FIG. 5 is a schematic plan view illustrating a post-exposure baking device according to the present embodiment in a state where a cover of the device is removed.

Post-exposure baking device PEB, as shown in FIG. 4, has a cover 40, a receiving part 50, a heating part 60, a seating part 80, a cooling part 90, an elevating pin 100, and a control part 110. When wafer W having a resist film formed thereon is exposed and is formed with a resist pattern through a developing process, post-exposure baking device PEB performs a heating process for heating exposed wafer W before the developing process.

Also, the heating device in the present disclosure includes control part 110 for controlling the heating device.

Cover 40 is positioned at the upper side, and is provided in such a manner that it can move upward and downward during incoming/outgoing of wafer W. At the center of the zenith of cover 40, one end of a supply tube 41 is opened. Supply tube 41 is provided while penetrating cover 40. The other end of supply tube 41 is connected to a supply source (not shown) for supplying air with controlled temperature/humidity. Thus, the air with controlled temperature/humidity can be supplied into a process chamber S through supply tube 41 from the supply source (not shown). Also, in the circumferential periphery of the zenith of cover 40, one end of an exhaust pipe 42 is opened. Exhaust pipe 42 is provided while penetrating cover 40. The other end of exhaust pipe 42 is connected to an exhaust part (not shown) for exhausting air. Thus, it is possible to uniformly exhaust atmosphere within process chamber S through exhaust pipe 42 by the exhaust part. Also, as shown in FIG. 4, a plurality of openings of exhaust pipe 42 may be formed. In this case, a plurality of exhaust pipes 42 formed with a plurality of openings may be connected to the exhaust part by being united with each other halfway. During a post-exposure baking, a photosensitive portion included in resist is chemically reacted by heat. Accordingly, supply tube 41 and exhaust pipe 42 circulate a predetermined amount of air into process chamber S during the post-exposure baking.

Also, in cover 40, a baffle plate 43 for separating an opening area of supply tube 41 and exhaust pipe 42 from process chamber S may be provided. Baffle plate 43 allows the flow of air supplied into process chamber S through supply tube 41, and air exhausted through exhaust pipe 42 from the inside of process chamber S, to be uniform within the plane of wafer W.

Receiving part 50 is positioned at the lower side, and forms process chamber S by coupling with cover 40. At the center of receiving part 50, from an upper side to a lower side, seating part 80, heating part 60, and cooling part 90 are provided. Also, as shown in FIGS. 4 and 5, in the circumferential periphery of receiving part 50, in any other area than wafer W's disposition area, a light shielding member 51 for preventing light from heating part 60, from leaking to the upper side of wafer W is provided.

Figure 5:
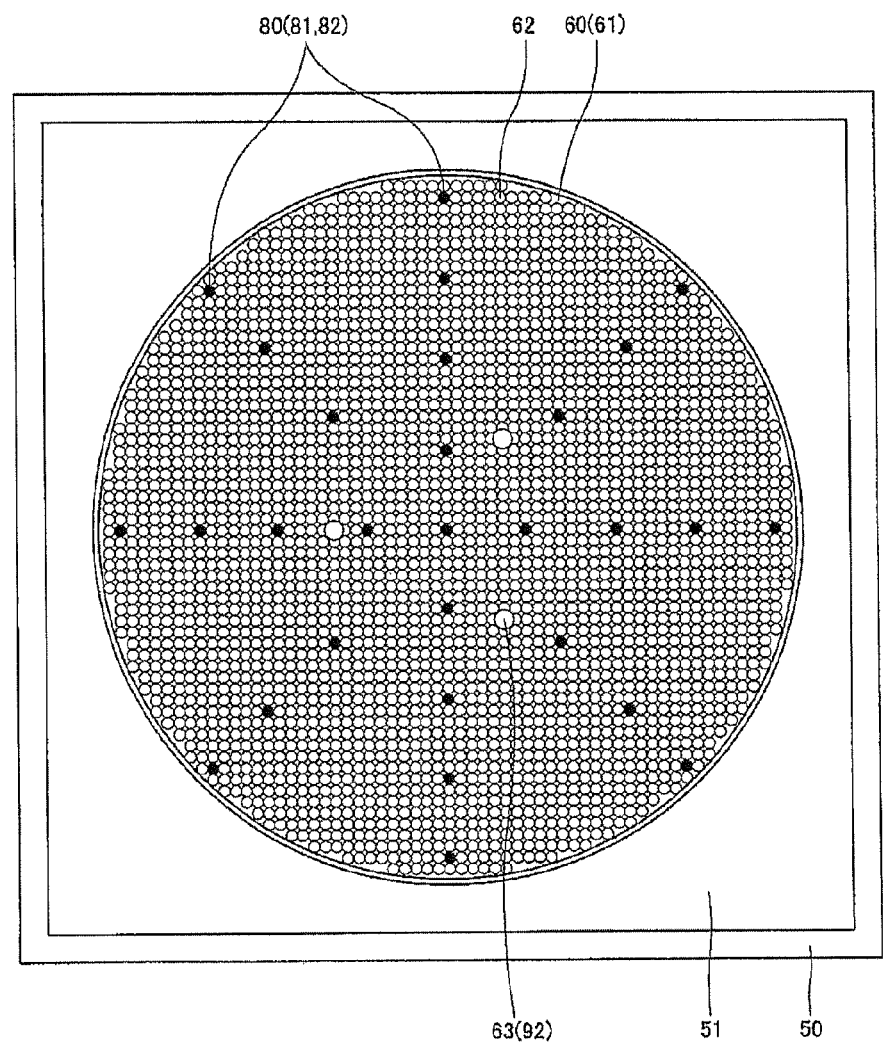
FIG. 5 is a schematic plan view illustrating a post-exposure baking device according to a first embodiment in a state where a cover of the device is removed.

As shown in FIG. 5, heating part 60 includes a plurality of light emitting diodes LEDs 62 which are arranged in an approximately lattice form, that is, in a two-dimensional form, on the approximately same plane of a module substrate 61, and heat wafer W. LEDs 62 emit infrared rays. Heating part 60 performs a heating process on exposed wafer W. Also, hereinafter, LEDs 62 emitting infrared rays are referred to as infrared LEDs.

Also, as a light emitting element emitting infrared rays, besides an LED, various kinds of light emitting elements such as a semiconductor laser may be used.

Also, for example, when wafer W made of Si is heated, in the present embodiment, infrared rays with a wavelength within a range of 850 nm to 1000 nm may be used.

As shown in FIG. 5, infrared LEDs 62 are regularly arranged in an approximately lattice form with no gap. Thus, it can be said that in heating part 60, a plurality of small-size heating elements are disposed.

Also, in the description of the present embodiment, as heating elements, light emitting elements emitting infrared rays are used. However, a plurality of small heating elements may be disposed, or a plurality of various kinds of heating elements (such as heaters) instead of the light emitting elements may be disposed.

As infrared LEDs 62, LEDs with a diameter of about 5 mmϕ be used. For example, when a diameter is about 5 mmϕ, as shown in FIG. 5, about 2950 infrared LEDs 62 may be used on module substrate 61 in order to correspond to 12-inch wafer size.

Also, infrared LEDs 62 may be turned off when wafer W is not seated on seating part 80, while they may be turned on when wafer W is seated on seating part 80.

As shown in FIG. 4, seating part 80 has a plurality of protrusions 81 protruding from the upper side of heating part 60. In other words, seating part 80 is provided at the upper side of heating part 60. Wafer W is disposed while being supported by the plurality of protrusions 81. By the supporting of wafer W by the plurality of protrusions 81, seating part 80 can support wafer W while keeping a predetermined distance from the upper side of heating part 60 including arranged infrared LEDs 62. Accordingly, between a lower surface of wafer W and heating part 60, a space may be formed. Due to the formation of the space, even in a case where dust is attached on heating part 60, it is possible to prevent the dust from being attached on wafer W. Also, it is possible to prevent infrared LEDs 62 themselves from being heated and damaged by wafer W heated by infrared LEDs 62. Also, the predetermined distance may be, for example, about 100 μm.

In the plurality of protrusions 81, temperature sensors 82 for measuring a temperature of seated wafer W are provided. Due to the temperature sensors 82, it is possible to measure the temperature of wafer W at a position nearer to wafer W.

The plurality of protrusions 81 are preferably provided in such a manner that they are two-dimensionally approximately equally dispersed and disposed from the perspective of a plane. For example, they may be arranged in a lattice form, or may be arranged with a predetermined angle along the circumferential direction of wafer W. For example, they may be radially provided around a central axis, thereby forming n symmetrical shapes (n indicates a natural number). Thus, even a small number of protrusions 81 can stably support wafer W in an approximate circle shape, and can uniformly measure the temperature of wafer W. In the example shown in FIG. 5, they are arranged in a lattice form, thereby forming 4 symmetrical shapes. Also, in the example, protrusions 81 are provided at 29 points.

Also, in the present embodiment, seating part 80 is supported by heating part 60 while seating part 80 and heating part 60 are integratedly provided. However, it is not necessary that seating part 80 is supported by heating part 60. For example, apart from heating part 60, seating part 80 may be supported by receiving part 50 or a supporting member (not shown) supporting receiving part 50.

As shown in FIG. 4, cooling part 90 is provided at the lower side of heating part 60. Cooling part 90 cools wafer W or heating part 60. Cooling part 90 has approximately the same circular shape as heating part 60, from the perspective of a plane. Within cooling part 90, for example, a cooling member 91 such as a Peltier element is embedded so as to adjust the temperature of cooling part 90 to a predetermined temperature. Otherwise, within cooling part 90, a cooling water tube through which cooling water flowed may be formed so as to cool cooling part 90 by the cooling water. Also, cooling part 90 may be formed in a shape large enough to cover at least heating part 60 from the perspective of the plane, and also, for example, may include a wider area than wafer W.

As shown in FIGS. 4 and 5, elevating pin 100 is elevatably provided while supporting wafer W from the lower side. Elevating pin 100 is moved upward and downward by an elevating mechanism 101, and can raise and lower wafer W supported from the lower side. In the periphery of the center of heating part 60 and cooling part 90, a plurality of through-holes 63 and 92 penetrating heating part 60 in the thickness direction are formed. FIG. 5 shows an example in which 3 through-holes 63 are formed. Elevating pins 100 can protrude from the upper side of heating part 60 while passing through through-holes 63 and 92. Accordingly, elevating pins 100 can transfer wafer W between first carrying device 9 and seating part 80.

Control part 110 controls heating part 60. Also, control part 110, as described below, controls heating part 60 through main body controlling unit 30 based on the distribution of wafer W's resist pattern's CDs measured by critical dimension measuring device 20. In other words, control part 110 performs a control process in such a manner that heating part 60 performs a heating process on one wafer W. The control process is included in the heating step in the coating/developing method.

In post-exposure baking device PEB as configured above, first, cover 40 is moved upward, and then first carrying device 9 on which wafer W is seated is moved, thereby moving wafer W to the upper side of seating part 80. Wafer W moved to the upper side of seating part 80 is transferred to elevating pins 100, and is seated on seating part 80 by elevating pins 100. After the seating of wafer W on seating part 80, cover 40 is moved down, and wafer W is loaded into process chamber S. Herein, infrared LEDs 62 are still turned off.

After the seating of wafer W on seating part 80, air with controlled temperature/humidity is supplied to process chamber S from supply tube 41, and the supplied air is exhausted through exhaust pipe 42. Thus, a predetermined amount of air is circulated. In this state, infrared LEDs 62 are turned on by control part 110, thereby heating wafer W.

Control part 110 controls the light output of infrared LEDs 62, and controls light quantity coming to wafer W from infrared LEDs 62. Then, after a predetermined time period, control part 110 turns off infrared LEDs 62, thereby stopping the heating of wafer W. Herein, control part 110 can individually control power fed to each of infrared LEDs 62. In other words, control part 110 can be configured in such a manner that it can individually control light quantity of infrared rays coming to wafer W from each of infrared LEDs 62.

Also, control part 110 may control power fed to each of infrared LEDs 62 in groups of a plurality of infrared LEDs 62. In other words, control part 110 may be configured in such a manner that it can control light quantity of infrared rays coming to wafer W from each of infrared LEDs 62 in groups of a plurality of infrared LEDs 62.

Otherwise, control part 110 may control the time for feeding power to each of infrared LEDs 62. In other words, control part 110 may adjust the light quantity of infrared rays coming to wafer W from each of infrared LEDs 62 by turning on each of infrared LEDs 62 by pulse modulation, and changing a time ratio of ON to OFF of each of infrared LEDs 62.

In the present embodiment, as shown in FIG. 5, protrusions 81 and temperature sensors 82 are provided at 29 points. Hereinafter, a process for correcting these temperature sensors in accordance with an indication value of a wafer for temperature measurement will be described. The temperature sensor of a temperature measurement wafer is, for example, positioned at a point corresponding to the position of temperature sensor 82.

First, the temperature measurement wafer is placed in a process chamber, and is heated in such a manner that the measurement value of the temperature measurement wafer can be an objective temperature (e.g., 110□). Then, at this time, the temperature of temperature sensor 82 is read. Next, in order to correspond to the temperature of the temperature measurement wafer, the temperature setting values of temperature sensors 82 at 29 points may be corrected by adding/subtracting the read temperature values of temperature sensors 82.

After the heating of wafer W is stopped, wafer W is continuously seated on seating part 80 and is cooled by cooling member 91 or cooling part 90 cooled by cooling water. Then, when wafer W is cooled to a predetermined temperature, wafer W is transferred to elevating pins 100 from seating part 80 by upward moving of cover 40. Wafer W transferred to elevating pins 100 is unloaded to the outside of post-exposure baking device PEB by being transferred to first carrying device 9. Then, a series of heating processes are ended.

Figure 6:
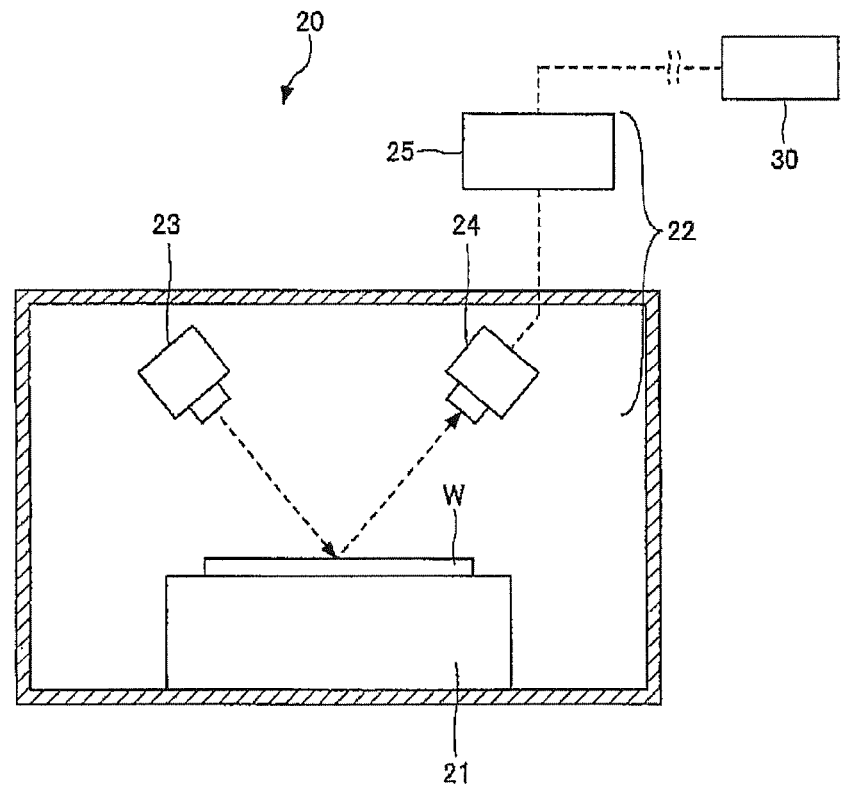
FIG. 6 is a vertical-sectional view schematically illustrating the configuration of a critical dimension measuring device.

In the present embodiment, during a control process for performing a heating process on wafer W by heating part 60, control part 110 corrects a setting temperature of heating part 60 based on temperature correction values obtained from critical dimension measuring device 20's previously measured CDs of a resist pattern within a plane of another wafer W, and then controls heating part 60 based on the corrected setting temperature. This control method will be described together with critical dimension measuring device 20 with reference to FIG. 6. FIG. 6 is a vertical-sectional view schematically illustrating the configuration of a critical dimension measuring device.

Critical dimension measuring device 20, for example, as shown in FIG. 6, includes a seating part 21 for horizontally seating wafer W, and an optical surface shape measuring system 22. Seating part 21, for example, has an X-Y stage, and can be moved in a horizontal two-dimensional direction. Optical surface shape measuring system 22, for example, includes an irradiation part 23, a photodetector 24, and a calculator 25. Irradiation part 23 irradiates light on wafer W in the inclined direction. Photodetector 24 detects light which is irradiated from irradiator 23 and is reflected from wafer W. Calculator 25 calculates CDs of a resist pattern on wafer W based on photo-receiving information of photodetector 24. Critical dimension measuring device 20, for example, measures CDs of a resist pattern by using a scatterometry method. When the scatterometry method is used, calculator 25 compares photodetector 24's detected light intensity distribution within a plane of wafer W, with previously recorded virtual light intensity distribution. Then, by obtaining resist pattern's CDs corresponding to the compared virtual light intensity distribution, it is possible to measure CDs of a resist pattern.

Also, critical dimension measuring device 20 may measure CDs at a plurality of measurement points within a plane of wafer W by horizontally moving wafer W with respect to irradiation part 23 and photodetector 24. The result measured by critical dimension measuring device 20 may be, for example, output from calculator 25 to main body controlling unit 30 as described below. The measurement result output to main body controlling unit 30 is transferred to control part 110 of post-exposure baking device PEB through main body controlling unit 30. Based on the measurement result transferred to control part 110, control part 110 adjusts and controls the setting temperature of heating part 60.

Figure 7:
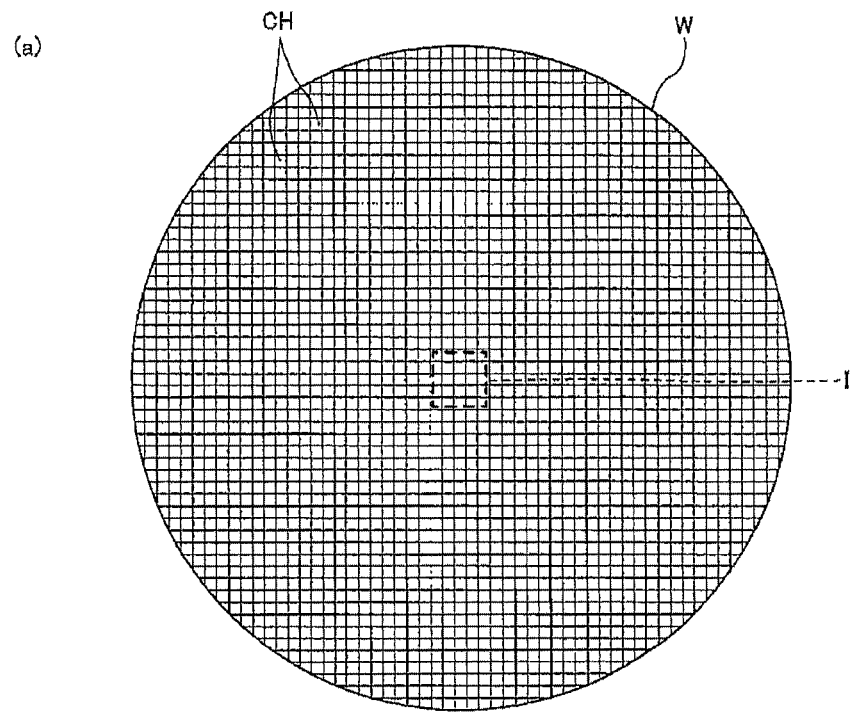
FIG. 7 is a plan view illustrating the relationship of disposition of a plurality of chips arranged and formed on a wafer, with measurement points for measuring critical dimensions (CDs) of a resist pattern formed on the wafer.
Figure 7:
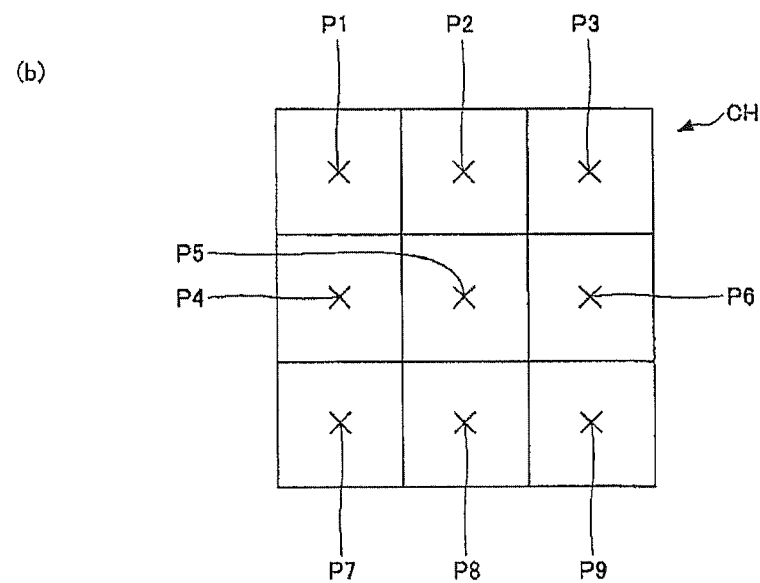
Figure 8:
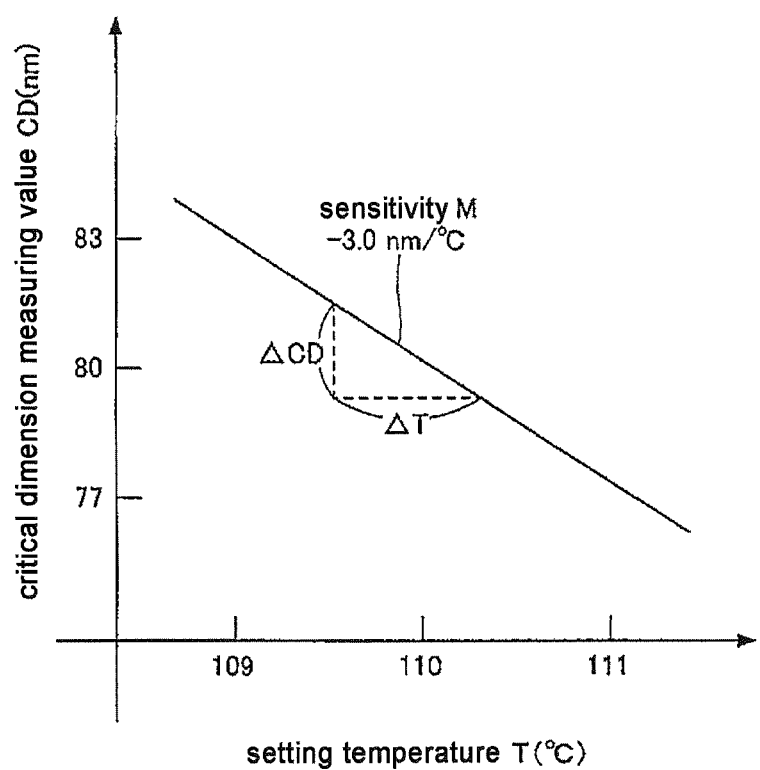
FIG. 8 is a graph illustrating the relationship of measured CDs and setting temperatures (T).

Hereinafter, a method for adjusting and controlling the setting temperature of heating part 60 by control part 110 of post-exposure baking device PEB based on the distribution of critical dimension measuring device 20's measured CDs of a resist pattern within a plane of wafer W will be described with reference to FIGS. 6 to 8. FIG. 7 is a plan view illustrating the relationship of disposition of a plurality of chips arranged and formed on a wafer, with measurement points for measuring CDs of a resist pattern formed on the wafer. FIG. 8 is a graph illustrating the relationship of measured CDs and setting temperatures (T).

In the description on the present embodiment, as shown in FIG. 7(a), for example, in 12-inch wafer W, chips CH having a square chip size of 15 mm×15 mm are formed. When such square chips (shots) CH with a size of 15 mm×15 mm are formed, a total of 321 chips (shots) CH, including chips having a partially damaged square shape in the outer circumferential periphery of wafer W (that is, damaged shots), are formed.

Also, in the present embodiment, a chip size indicates an area of one shot divided by a reticle used for exposure. However, it may be preferably one piece in a shape periodically arranged on wafer W, and in actuality, may be an actual chip size formed on wafer W (same as that in a modified embodiment and another embodiment as described below).

Also, in the present embodiment, as shown in FIG. 7(b), within an area of one chip CH, a total of 9 points (height: 3 points×width: 3 points=9 points) are set as measurement points P1 to P9 for measuring CDs. Herein, measurement points P1 to P9 for measuring CDs are two-dimensionally arranged with an arrangement interval of height 5 mm and width 5 mm.

Meanwhile, as described above with reference to FIG. 5, in heating part 60, infrared LEDs 62 of 5 mmϕ are arranged with no gap. Accordingly, positions of respective measurement points P1 to P9 for measuring CDs approximately one-to-one correspond to positions of respective infrared LEDs 62. Under this condition, control part 110 of post-exposure baking device PEB corrects the setting temperature of heating part 60 based on temperature setting values obtained from critical dimension measuring device 20's previously measured CDs of a resist pattern of a test wafer WT. Then, based on the corrected setting temperature, heating part 60 is controlled.

Also, in the present embodiment, the arrangement interval of infrared LEDs 62 is smaller than that of chips CH of wafer W. Accordingly, in a first modified embodiment of the first embodiment, as described below, it is possible to reduce CDs' variation caused by an error in a reticle during exposure, aberration of a lens, or a variation of an exposure level within a shot (chip).

Resist is previously coated in advance on test wafer WT, and test wafer WT coated with resist is subjected to a heating process, thereby forming a resist film on test wafer WT. Then, test wafer WT formed with the resist film is exposed, and then is subjected to a heating process by heating part 60. Then, test wafer TW which has been subjected to the heating process by heating part 60 is developed, thereby forming a resist pattern on test wafer WT.

Next, test wafer WT formed with the resist pattern is carried to critical dimension measuring device 20, and is seated on seating part 21 as shown in FIG. 6. Then, light is irradiated on a predetermined portion of a surface of test wafer WT from irradiation part 23, reflected light of the irradiated light is detected by photodetector 24, and calculator 25 calculates CDs of the resist pattern on test wafer W. In critical dimension measuring device 20, test wafer WT is horizontally moved with respect to irradiation part 23 and photodetector 24. Also, as described above with reference to FIGS. 7(a) and 7(b), in each of 321 chips two-dimensionally arranged within a plane of test wafer WT (except for damaged chips), at each of 9 measurement points P1 to P9, a CD is measured.

Test wafer WT which has been subjected to CD measurement is returned to cassette C of cassette station 2. Then, the CD measurement result at respective measurement points within a plane of test wafer WT is output to main body controlling unit 30. In main body controlling unit 30, the distribution of the CDs measured at respective measurement points within a plane of test wafer WT is obtained.

After the distribution of CDs measured at respective measurement points within a plane of test wafer WT is obtained, temperature correction values ΔT at the respective measurement points within the plane of test wafer WT is calculated by a relational expression (1) below in main body controlling unit 30.

$$\Delta CD = M \cdot \Delta T \quad (1)$$

ΔCD indicates a CD variation such as a difference (CD−CDO) between a measured CD and a predetermined objective critical dimension (CDO). Also, the temperature correction value ΔT indicates a difference (T−TO) between an uncorrected setting temperature (TO) and a corrected setting temperature (T). Also, M indicates a temperature coefficient obtained by correlation between the previously obtained CD variation (ΔCD) and the temperature correction value ΔT.

As shown in FIG. 8, for example, in a case of positive resist for ArF immersion exposure, etc., as a post exposure temperature increases, a CD generally shows a tendency to be thinner. In the example of FIG. 8, a measured CD (nm) is in approximately inverse proportion to an uncorrected setting temperature TO (□), in which the sensitivity is −3.0 nm/□. Accordingly, main body controlling unit 30 can calculate temperature correction values ΔT in respective infrared LEDs 62 corresponding to respective measurement points from CDs measured at the respective measurement points, by using relational expression (1).

In the present embodiment, as shown in FIG. 5, protrusions 81 and temperature sensors 82 are provided at 29 points. In this case, from respective measurement points' data obtained as described above, an objective temperature distribution may be obtained by an approximate curve. Then, in the objective temperature distribution, temperature correction values ΔT of measurement points corresponding to temperature sensors 82 at 29 points may be used to correct temperature setting values of temperature sensors 82 at 29 points. Hereinafter, at some of the respective measurement points whose temperatures have been obtained from the CD measurement result of critical dimension measuring device 20, an example for correcting setting temperature T of heating part 60 by using temperature correction values ΔT will be described.

Next, the information on respective temperature correction values ΔT is output to control part 110 of post-exposure baking device PEB from main body controlling unit 30. Then, based on the information of the respective temperature correction values ΔT, control part 110 corrects the setting temperature of heating part 60, and adjusts the temperature to a new setting temperature. Herein, based on the setting temperature of heating part 60, a temperature measured by temperature sensor 82 is controlled to reach the setting temperature. Also, based on the corrected (adjusted) setting temperature, control part 110, for example, controls heating part 60 in such a manner that the temperature measured by temperature sensor 82 is to be the corrected setting temperature. As described above, since temperature sensor 82 provided in protrusion 81 allows the temperature of wafer W to be measured at a position nearer to wafer W, it is possible to control the temperature of wafer W with higher precision during the control of heating part 60 by control part 110.

Also, when control part 110 controls heating part 60 in such a manner that the temperature measured by temperature sensor 82 is to be the corrected setting temperature, it is possible to correct the temperature setting value with higher precision by increasing the number of temperature sensors 82.

Also, besides temperature sensors 82 provided in seating part 80, for example, a temperature sensor for measuring the temperature of wafer W may be provided in module substrate 61. Herein, heating part 60 may be controlled in such a manner that the temperature measured by the temperature sensor is to be the corrected setting temperature.

Also, in module substrate 61, temperature sensors may be provided with approximately the same arrangement interval as that of infrared LEDs 62. Otherwise, after temperature dependence of current-voltage characteristics of respective infrared LEDs 62 is previously obtained, control part 110 may allow the heating temperature to be calculated from current-voltage characteristics of respective infrared LEDs 62. As described above, due to the providing of temperature sensors with approximately the same arrangement interval as that of infrared LEDs 62, it is possible to uniformize the temperature of wafer W with approximately the same spatial resolution as that of infrared LEDs 62.

Also, in the description of the present embodiment, when product wafer W is subjected to a heating process, the setting temperature of heating part 60 is corrected based on a temperature correction value previously obtained from test wafer WT. However, when latter product wafers W are subjected to a heating process, the setting temperature of heating part 60 may be corrected based on the temperature correction value obtained from first product wafer W.

Meanwhile, a comparative embodiment of the present embodiment will be described with reference to FIGS. 9 to 11, in which in post-exposure baking device PEB, a heating part is not provided with a plurality of heating elements which are two-dimensionally arranged and heat wafer W.

Figure 9:
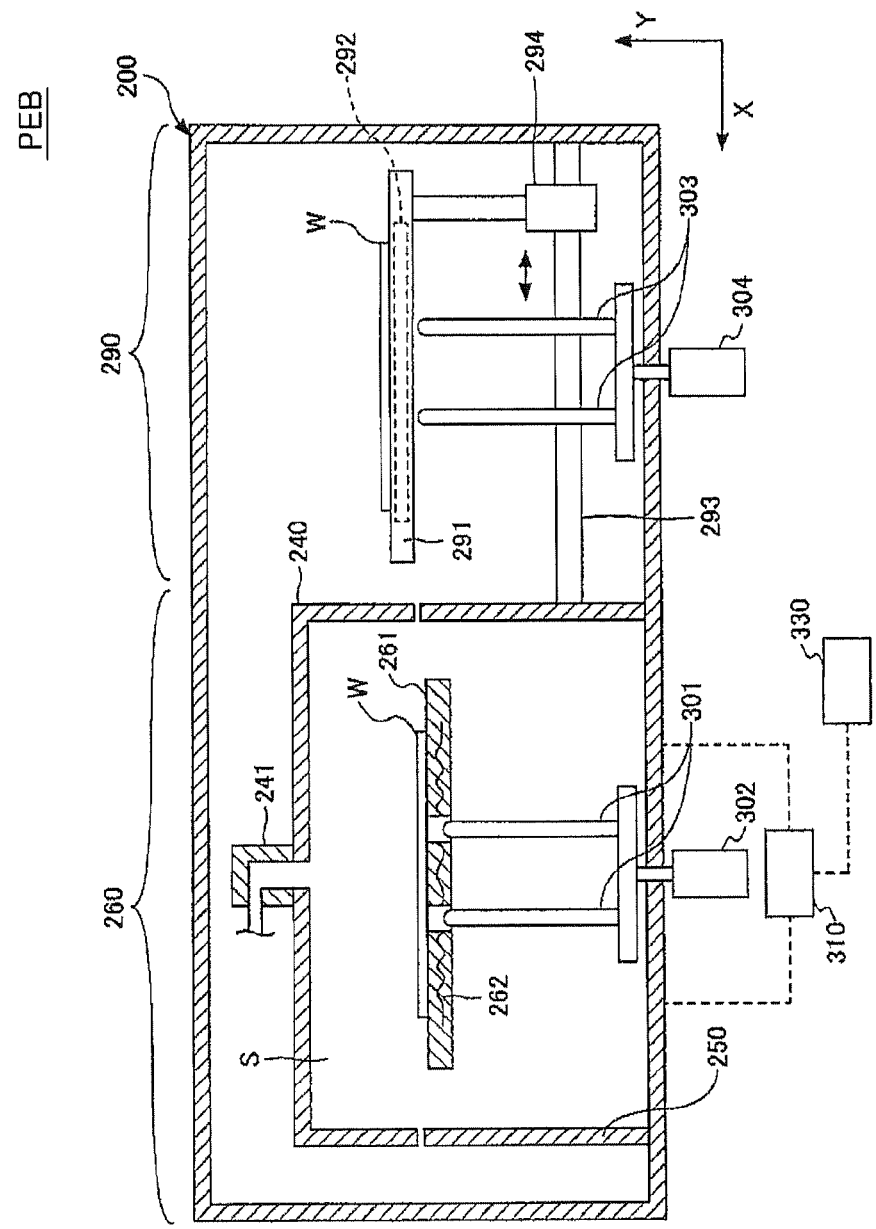
FIG. 9 is a schematic front view illustrating a post-exposure baking device according to a comparative embodiment.
Figure 10:
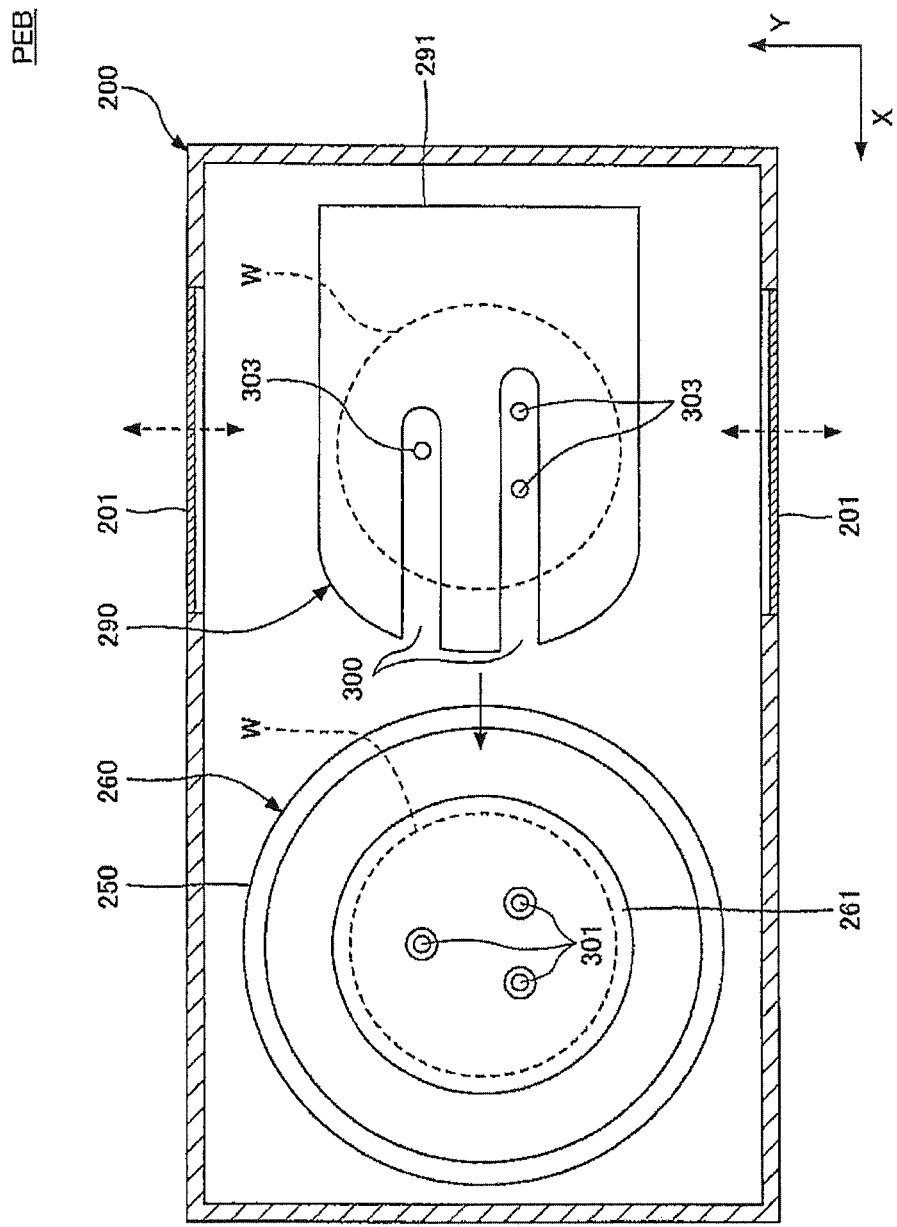
FIG. 10 a schematic plan view illustrating a post-exposure baking device according to a comparative embodiment.
Figure 11:
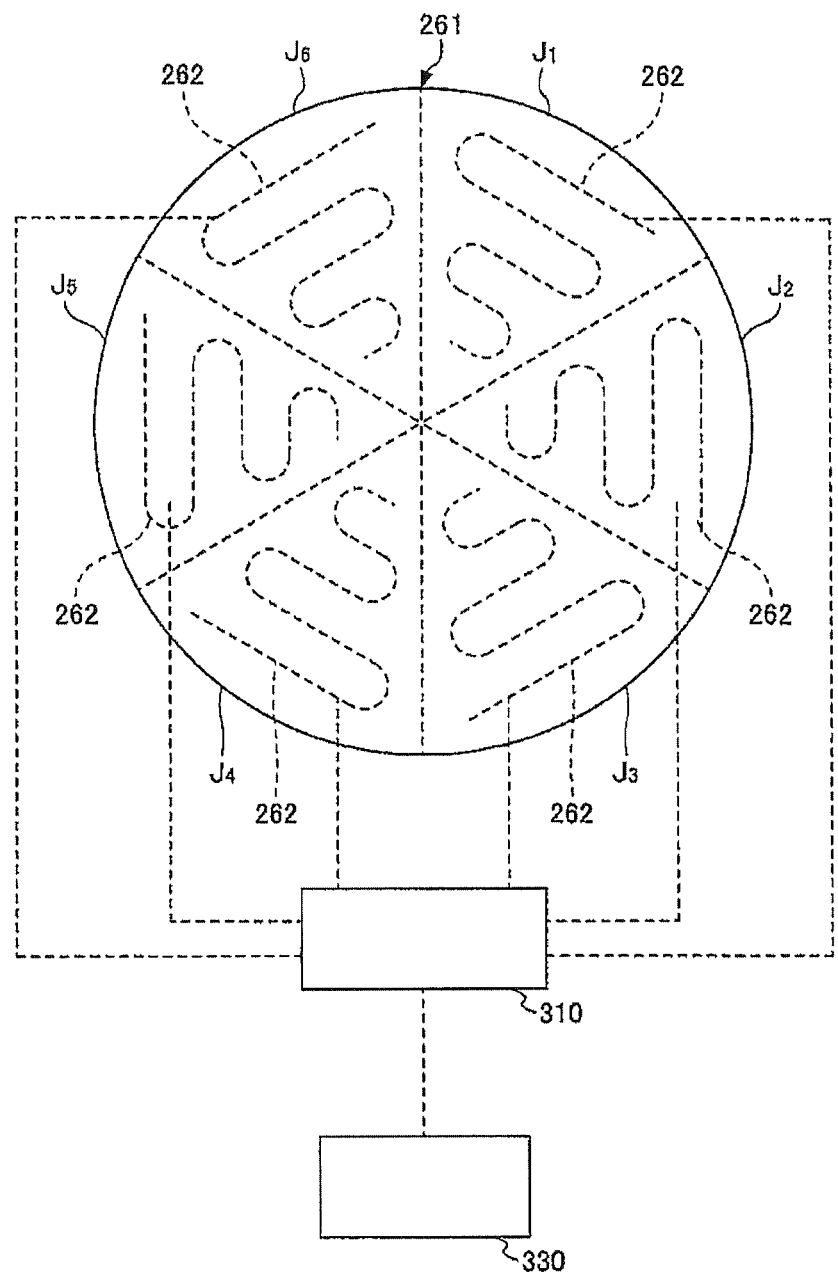
FIG. 11 is a plan view illustrating the schematic configuration of a heating plate of a post-exposure baking device according to a comparative embodiment.

FIGS. 9 and 10 are a schematic front view and a schematic plan view which illustrate a post-exposure baking device according to a comparative embodiment. FIG. 11 is a plan view illustrating the schematic configuration of a heating plate of a post-exposure baking device according to a comparative embodiment.

Post-exposure baking device PEB according to a comparative embodiment, as shown in FIGS. 9 and 10, includes a heating part 260 for heating wafer W and a cooling part 290 for cooling wafer W, within a case 200.

Heating part 260, as shown in FIG. 9, includes: a cover 240 which is positioned at the upper side and can be moved upward and downward 240; and a receiving part 250 which is positioned at the lower side and forms a process chamber S by coupling with cover 240.

At the center of the zenith of cover 240, an exhaust pipe 241 is connected. The atmosphere within process chamber S can be exhausted to an exhaust part (not shown) through exhaust pipe 241.

Also, in post-exposure baking device PEB according to a comparative embodiment includes a heating plate 261, instead of a heating part provided with a plurality of two-dimensionally arranged heating elements. As shown in FIG. 11, heating plate 261 is divided into a plurality of, for example, 6, heating plate areas J1, J2, J3, J4, J5, and J6. For example, heating plate 261 is divided into 6 equal parts of heating plate areas J1 to J6 in a fan shape from the perspective of a plane level.

In each of heating plate areas J1 to J6 of heating plate 261, a heater 262 is individually embedded which is heated by power supply and can heat each of heating plate areas J1 to J6. The heating value of heater 262 in each of heating plate areas J1 to J6 is, for example, adjusted by a control part 310. Also, control part 310 is connected to a main body controlling unit 330.

In cooling part 290, a cooling plate 291 for seating and cooling wafer W is provided. Cooling plate 291, for example, as shown in FIG. 10, has an approximately squared flat panel shape, and its one side surface toward heating plate 261 is curved in a circular arc shape projecting outward. Within cooling plate 291, for example, a cooling member 292 such as a Peltier element is embedded so as to adjust the temperature of cooling plate 291 to a predetermined temperature in the same manner as the present embodiment.

Cooling plate 291 is attached on a rail 293 stretching toward heating plate 261's side. Cooling plate 291 can move to the upper side of heating plate 261 by moving on rail 293 by a driving part 294. As shown in FIG. 10, case 200's both side walls across cooling plate 291 are formed with loading inlets 201 for loading/unloading wafer W.

Also, in cooling plate 291, two slits 300 in the X direction are formed. These slits 300 prevent cooling plate 291 moved toward heating part 260, from being interfered with elevating pins 301 protruding from the upper side of heating plate 261. Elevating pins 301 are elevatably driven by an elevating mechanism 302. Also, at the lower side of cooling plate 291, elevating pins 303 are provided. Elevating pins 303 are elevatably driven by an elevating mechanism 304. Elevating pins 303 can be moved upward from the lower side of cooling plate 291, and can protrude from the upper side of cooling plate 291 by passing through slits 300.

In the comparative embodiment, within each of heating plate areas J1 to J6, the heating value of heater 262 cannot be adjusted in further segmented areas. For this reason, even if temperature sensors are provided at 29 points in the same manner as described in the present embodiment, it is impossible to adjust the heating value of heater 262 in each of heating plate areas J1 to J6 so as to correct the temperature distribution measured by the temperature sensors. Accordingly, it is impossible to correct the temperature setting values of temperature sensors by using temperature correction values at the respective measurement points whose temperatures have been obtained from the CD measurement result of a critical dimension measuring device, and to reduce a variation of CDs within a plane of wafer W.

Also, in the comparative embodiment, in order to stabilize the temperature of heating plate 261 within each of heating plate areas J1 to J6, it is necessary to increase the temperature of heater 262 to a setting temperature by previously supplying power to heater 262 before post-exposure baking. For this reason, in both cases where wafer W is seated or not seated on heating plate 261, it is necessary to always heat heater 262 up to about 100□ by supplying power to heater 262, and to supply stand-by power to heater 262.

Also, in the comparative embodiment, cooling part 290 is provided adjacently to heating part 260. For this reason, an area (footprint) of case 200 of post-exposure baking device PEB is the sum of an area (footprint) of heating part 260 and an area (footprint) of cooling part 290.

Meanwhile, in the present embodiment, in heating part 60, a plurality of small-size heating elements 62 are disposed. Also, as described above, it is possible to use temperature correction values ΔT at a plurality of measurement points whose CDs have been measured by critical dimension measuring device 20, within a plane of wafer W. Accordingly, it is possible to correct the temperature setting values of all temperature sensors 82 at 29 points with higher precision, and to reduce a variation of CDs within a plane of wafer W.

Also, in the present embodiment, since wafer W is heated by irradiation of infrared rays, it is possible to supply power to each of heating elements 62 of heating part 60 only during post-exposure baking. For this reason, when wafer W is not seated on seating part 80, it is not necessary to supply power to heating part 60 and to supply stand-by power. Accordingly, it is possible to reduce power consumed in post-exposure baking device PEB.

Also, in the present embodiment, at the lower side of heating part 60, cooling part 90 is provided. For this reason, post-exposure baking device PEB requires an area (footprint) corresponding to that of heating part 60, and does not additionally require a separate area (footprint) for cooling part 90.

Specifically, for wafer W formed with a resist pattern having an objective critical dimension value of 83.9 nm, in order to determine the reduced extent of variation (3σ) of a CD within a plane of wafer W by temperature correction, the above described present embodiment was compared with a comparative embodiment. In the method according to the present embodiment, 3σ was largely reduced from 1.81 nm to 0.27 nm through temperature correction. Meanwhile, in the comparative embodiment, 3σ was reduced only from 1.81 nm to 1.61 nm through temperature correction. Accordingly, by correcting the temperature through the heating device and heating method according to the present embodiment, it is possible to reduce a variation of CDs within a plane of wafer W.

According to the present embodiment, as described above, based on measured CDs of a resist pattern within a plane of a former substrate, temperature correction values within a plane of a substrate are obtained, and then based on the temperature correction values, the setting temperature of a heating part is corrected during a heating process of a latter substrate. Accordingly, in a heating device for performing a heating process on a substrate, and a heating method in the heating device, it is possible to reduce a variation of CDs within a plane of a substrate, and to reduce power consumption.

Also, according to the present embodiment, at the lower side of a heating part, a cooling part is provided. Accordingly, there is no need to provide a cooling plate of the cooling part at a different position from the heating part from the perspective of a plane. Thus, it is possible to reduce a footprint of a resist coating/developing system.

First Modified Embodiment of the First Embodiment

Hereinafter, a heating device and a heating method according to a first modified embodiment of the first embodiment will be described with reference to FIG. 12.

The heating device and the heating method according to the present modified embodiment are different from those according to the first embodiment in that a temperature correction value is obtained based on an average of measured CDs of a resist pattern at a plurality of measurement points within a plane of a wafer.

Figure 12:
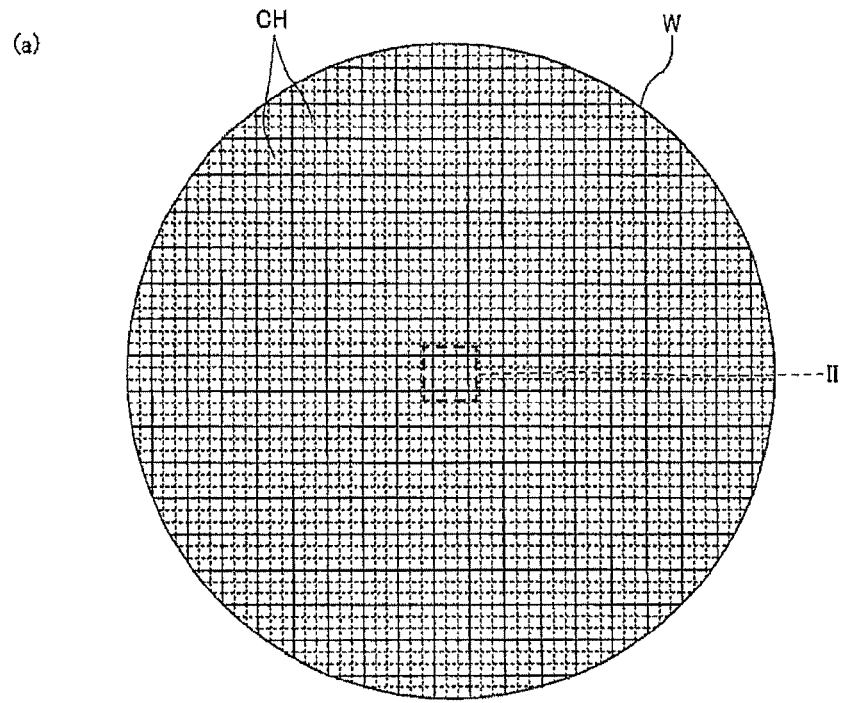
FIG. 12 is a plan view illustrating the relationship of disposition of a plurality of chips arranged and formed on a wafer, with measurement points for measuring CDs of a resist pattern formed on the wafer.
Figure 12:
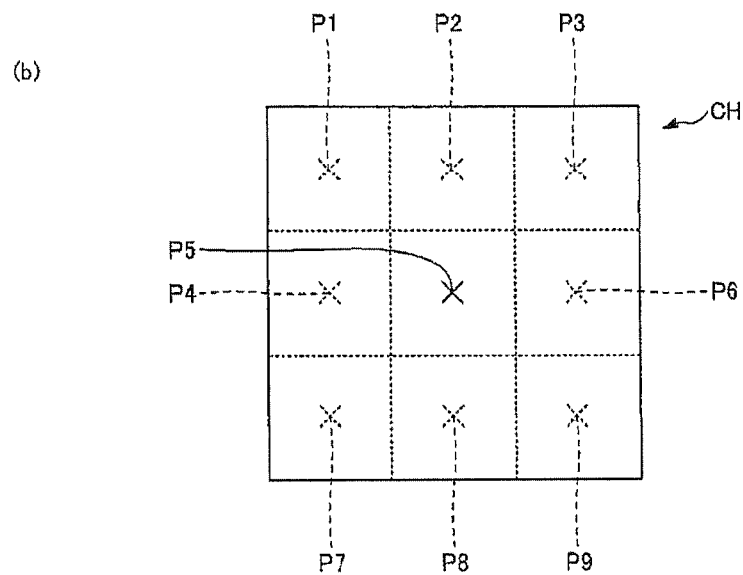

FIG. 12 is a plan view illustrating the relationship of disposition of a plurality of chips arranged and formed on a wafer, with measurement points for measuring CDs of a resist pattern formed on the wafer. Also, hereinafter, some parts described above may be designated by same reference numerals as those in the above described embodiment and their description may be omitted (same in modified embodiments and embodiments below).

In the description on the present modified embodiment, as shown in FIG. 12(a), for example, in 12-inch wafer W, chips CH having a square chip size of 15 mm×15 mm are formed. Also, in the present modified embodiment, as shown in FIG. 12(b), within an area of one chip CH, a total of 9 points (height: 3 points×width: 3 points=9 points) are set as measurement points for measuring CDs. In other words, measurement points for measuring CDs are two-dimensionally arranged with an arrangement interval of height 5 mm and width 5 mm.

However, in the present modified embodiment, when control part 110 performs a control process allowing heating part 60 to perform a heating process on one wafer W, an average CDAve of CDs measured at, for example, 9 measurement points P1 to P9 within chip CH is used. Then, CDAve is considered as a CD at a representative point of the measurement points in corresponding chip CH, for example, at a measurement point P5.

Also, in a case where measurement at a plurality of points within a chip is difficult due to time constraint, only one point, for example, P5, may be representatively measured and the measured value may be considered as a representative value of the chip.

After $CD_{Ave}$ of each chip CH of test wafer WT is obtained, a temperature correction value ΔT in each chip CH of test wafer WT is calculated by a relational expression (1) above in main body controlling unit 30. Next, the information on respective temperature correction values ΔT is output to control part 110 of post-exposure baking device PEB from main body controlling unit 30. Then, based on the information of the respective temperature correction values ΔT, control part 110 corrects the setting temperature of heating part 60, and adjust the temperature to a new setting temperature.

CD1 to CD9 at respective measurement points P1 to P9 within one chip CH, as described above with reference to FIG. 7, are divided into a $CD_{Ave}$ component of measurement values within chip CH, and a difference component D1 to D9 between CD1 to CD9 and $CD_{Ave}$ within chip CH. In other words, CD1=$CD_{Ave}$+D1, CD2=$CD_{Ave}$+D2, ... CD9=$CD_{Ave}$+D9. A variation of $CD_{Ave}$ components among chips CH is mainly caused by a variation of exposure levels within a plane of wafer W or a variation of temperatures of post-exposure baking. Also, a variation of difference components D1 to D9 within chip CH is mainly caused by an error in a reticle during exposure, aberration of a lens, or a variation of an exposure level within a shot (chip).

Accordingly, in the present modified embodiment, although $CD_{Ave}$ represents CD1 to CD9 at respective measurement points P1 to P9 within chip CH, it is possible to show a variation of exposure levels or post-exposure baking temperatures within a plane of wafer W.

In the present modified embodiment, not all of measurement values at respective critical dimension measurement points are used, and not all of temperature correction values at respective measurement points of test wafer WT are calculated. For example, an average value of CDs at measurement points within one chip is used. However, since an arrangement interval of chips CH is smaller than that of temperature sensors in the present modified embodiment, it is possible to uniformize the temperature within a plane of wafer W with a sufficient spatial resolution.

Specifically, for wafer W formed with a resist pattern having an objective CD value of 83.9 nm, in order to determine the reduced extent of variation (3σ) of CDs within a plane of wafer W by temperature correction, the present modified embodiment was compared with the comparative embodiment described in the first embodiment. In the method according to the present modified embodiment, 3σ was reduced from 1.81 nm to 1.26 nm through temperature correction. Meanwhile, in the comparative embodiment, 3σ was reduced only from 1.81 nm to 1.61 nm through temperature correction.

Accordingly, in the present modified embodiment, in the same manner as the first embodiment, it is possible to reduce a variation of CDs within a plane of a wafer, and to reduce throughput in a control part of a critical dimension measuring device, and a control part of a post-exposure baking device. Accordingly, it is possible to reduce a cost for devices, and power consumption.

Second Modified Embodiment of the First Embodiment

Hereinafter, a heating device and a heating method according to a second modified embodiment of the first embodiment will be described with reference to FIG. 13.

The heating device and the heating method according to the present modified embodiment are different from those according to the first embodiment in that temperature control is more minutely performed at the circumferential periphery side of a wafer, compared to that at the center side of the wafer.

Also, in the present modified embodiment, protrusions having temperature sensors may be provided with a smaller interval at the circumferential periphery side of a wafer, compared to that at the center side of the wafer. Also, the measurement on CDs may be performed with a smaller interval at the circumferential periphery side of the wafer, compared to that at the center side of the wafer. Otherwise, a plurality of heating elements may be provided with a smaller interval at the circumferential periphery side of the wafer, compared to that at the center side of the wafer. Representatively, in the case as described below, protrusions having temperature sensors are provided with a smaller interval at the circumferential periphery side of the wafer, compared to that at the center side of the wafer.

Figure 13:
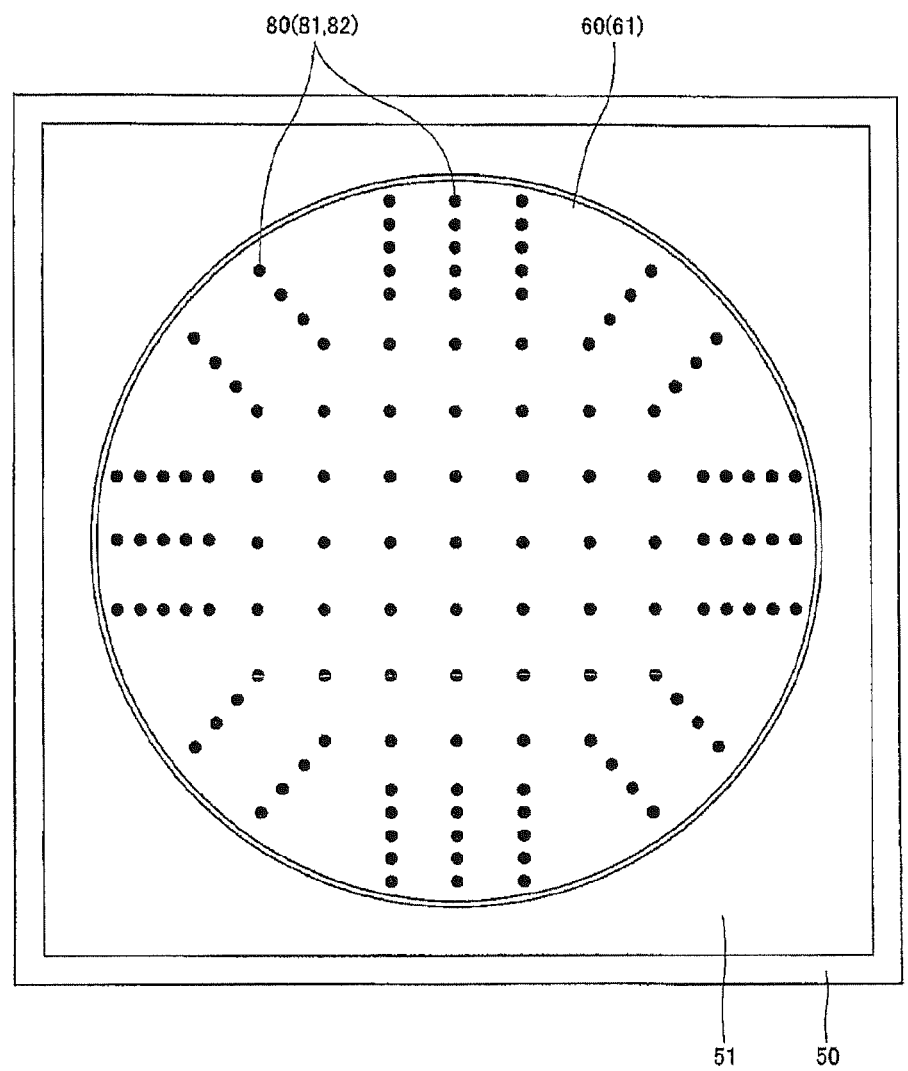
FIG. 13 is a schematic plan view illustrating a post-exposure baking device according to a second modified embodiment of a first embodiment in a state where a cover of the device is removed.

FIG. 13 is a schematic plan view illustrating a post-exposure baking device according to the present modified embodiment in a state where a cover of the device is removed. However, in FIG. 13, for the sake of easiness in illustration, infrared LEDs 62 and through-holes 63 are not shown.

In the present modified embodiment, as shown in FIG. 13, protrusions 81 provided with temperature sensors 82 are arranged and provided with a smaller interval at the circumferential periphery side, especially, at the vicinity of the outer circumference, compared to that at the center side of wafer W.

In the present modified embodiment, when a control process allowing heating part 60 to perform a heating process on product wafer W is performed, temperature correction values ΔT at the respective measurement points are calculated by a relational expression (1) above in main body controlling unit 30 based on CDs measured at measurement points within a plane of test wafer WT. Next, the information on respective temperature correction values ΔT is output to control part 110 of post-exposure baking device PEB from main body controlling unit 30. Then, based on the information of the respective temperature correction values ΔT, control part 110 corrects the setting temperature of heating part 60, and adjusts the temperature to a new setting temperature. Herein, also, based on the corrected (adjusted) setting temperature, control part 110 controls heating part 60 in such a manner that the temperature measured by temperature sensor 82 is to be the corrected setting temperature.

Herein, temperature sensors 82 (protrusions 81) are provided with a smaller interval at the circumferential periphery side, compared to that at the center side of wafer W. Thus, it is possible to control the temperature distribution of wafer W with higher precision during post-exposure baking at the circumferential periphery side of wafer W. As a result, it is possible to reduce a variation of CDs at the circumferential periphery side of wafer W like at the center side of wafer W.

Specifically, for wafer W formed with a resist pattern having an objective CD value of 83.9 nm, in order to determine the reduced extent of variation (3σ) of CDs within a plane of wafer W by temperature correction, the present modified embodiment was compared with the comparative embodiment described in the first embodiment. In the method according to the present modified embodiment, 3σ was reduced from 3.89 nm to 0.63 nm through temperature correction. Meanwhile, in the comparative embodiment, 3σ was reduced only from 3.89 nm to 2.42 nm through temperature correction. Thus, it is possible to more largely reduce the variation of CDs within a plane of wafer W.

Second Embodiment

Hereinafter, a heating device and a heating method according to a second embodiment will be described with reference to FIGS. 14 and 15.

The heating device and the heating method according to the present embodiment are different from those according to the first embodiment in that a heating part includes, between a plurality of light emitting elements and a wafer, a plurality of liquid crystal elements for transmitting or blocking infrared rays emitted from the light emitting elements.

Figure 14:
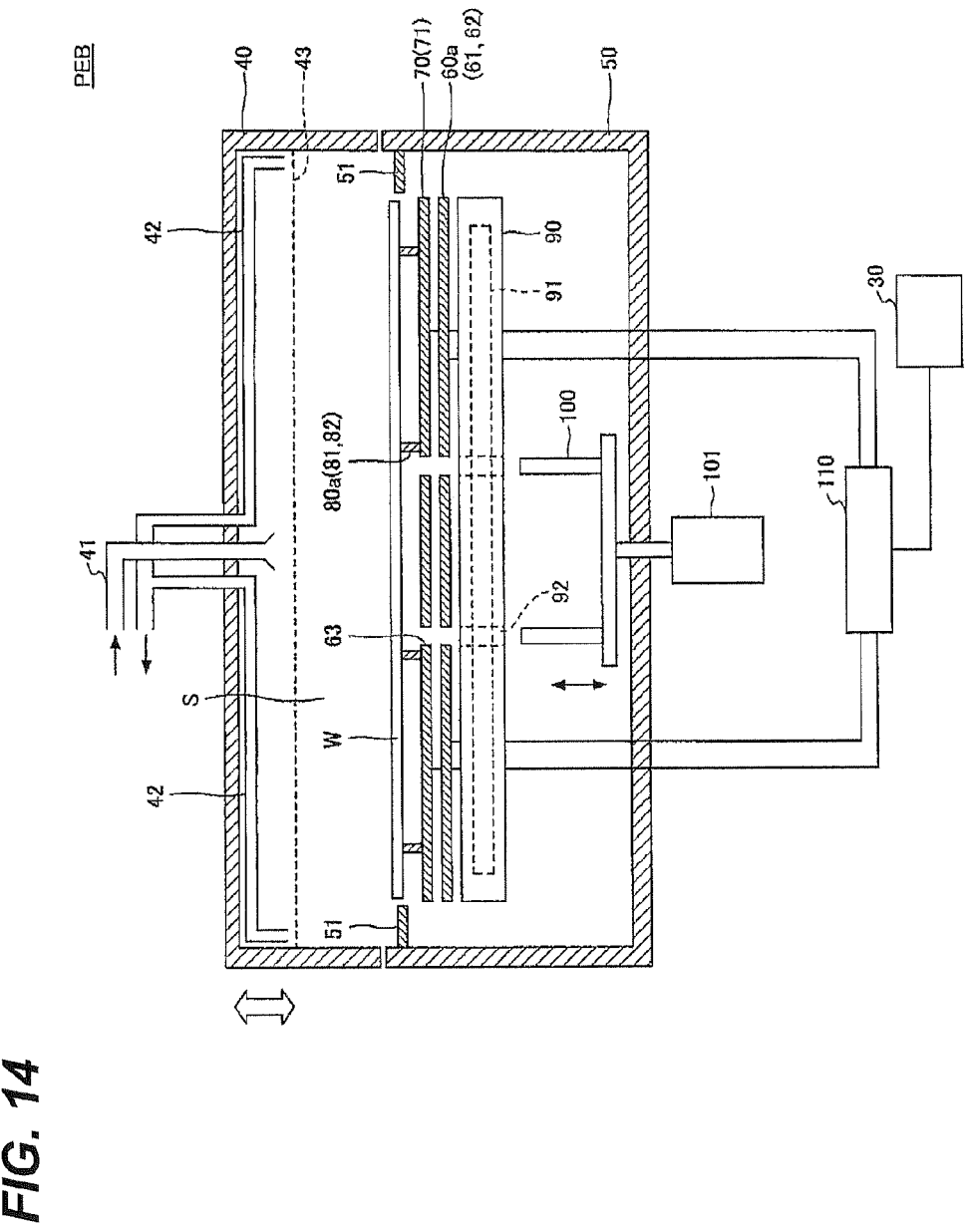
FIG. 14 is a schematic front view illustrating a post-exposure baking device according to a second embodiment.

FIG. 14 is a schematic front view illustrating a post-exposure baking device according to the present embodiment. FIG. 15 is a schematic plan view illustrating a post-exposure baking device according to the present embodiment in a state where a cover of the device is removed.

As shown in FIG. 14, like the first embodiment, post-exposure baking device PEB includes cover 40, receiving part 50, a heating part 60a, a seating part 80a, an elevating pin 100, and a control part 110. Also, cover 40, receiving part 50, elevating pin 100, and control part 110 are same as those in the first embodiment.

Meanwhile, heating part 60a is provided with a liquid crystal panel 70 including a plurality of liquid crystal elements 72, between light emitting elements 62 and wafer W. Also, seating part 80a is provided while protruding from the upper side of liquid crystal panel 70 of heating part 60a.

As shown in FIG. 14, heating part 60a has liquid crystal panel 70 between a plurality of light emitting elements 62 and wafer W. Liquid crystal panel 70, as shown in FIG. 15, includes liquid crystal elements (pixels) 72 which are two-dimensionally arranged in an approximately lattice form on the approximately same plane of a module substrate 71. Respective liquid crystal elements 72 controllably transmit or block infrared rays emitted from light emitting elements 62. Also, control part 110 controls the transmission ratio of infrared rays transmitting each of liquid crystal elements (pixels) 72 during a control process for a heating process on wafer W.

Figure 15:
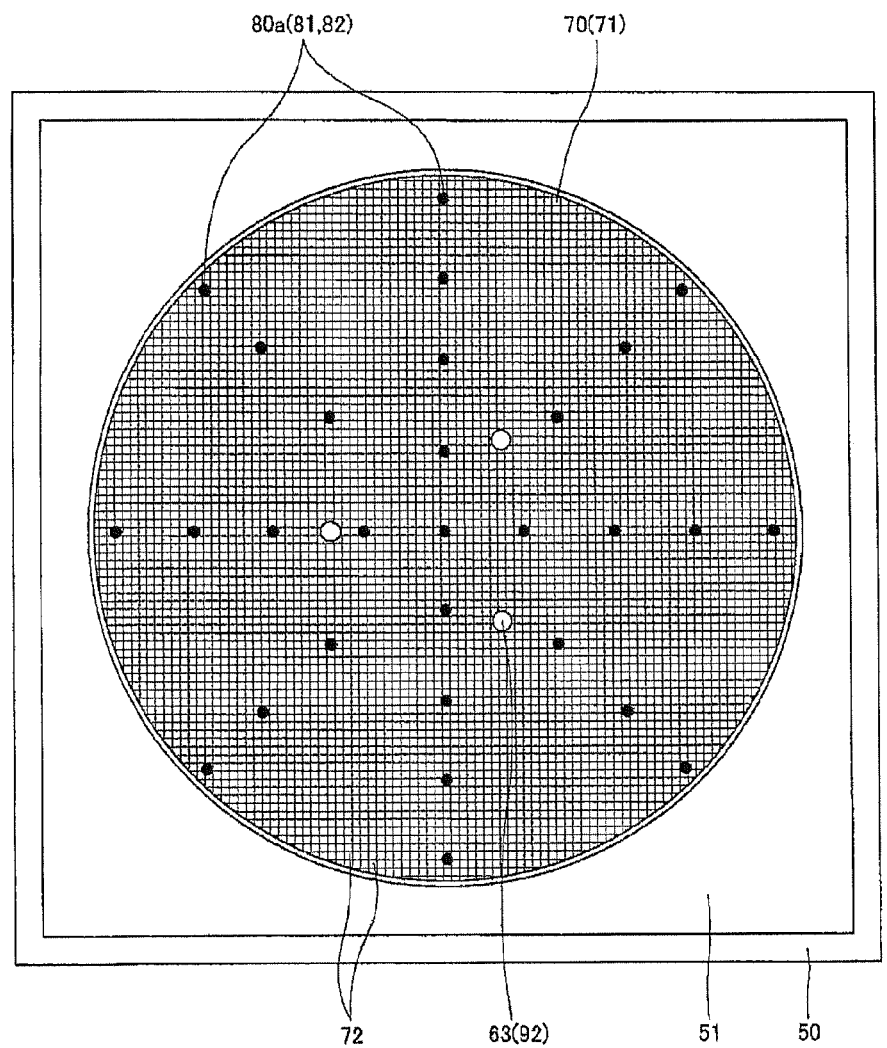
FIG. 15 is a schematic plan view illustrating a post-exposure baking device according to a second embodiment in a state where a cover of the device is removed.

As shown in FIG. 15, seating part 80a includes a plurality of protrusions 81 protruding from the upper side of liquid crystal panel 70 of heating part 60a. Wafer W is disposed while being supported by the plurality of protrusions 81. By the supporting of wafer W by the plurality of protrusions 81, seating part 80*a* can support wafer W while keeping a predetermined distance from the upper side of heating part 60*a* including liquid crystal panel 70 provided with arranged liquid crystal elements 72. Accordingly, between a lower surface of wafer W and heating part 60*a*, a space may be foamed. Due to the formation of the space, even in a case where dust is attached on heating part 60*a*, it is possible to prevent the dust from being attached on wafer W. Also, it is possible to prevent infrared LEDs 62 themselves from being heated and damaged by wafer W heated by infrared LEDs 62.

In the plurality of protrusions 81, temperature sensors 82 for measuring a temperature of seated wafer W are provided in the same manner as the first embodiment. Due to the temperature sensors 82, it is possible to measure the temperature of wafer W at a position nearer to wafer W.

Liquid crystal panel 70 used in the present embodiment may include liquid crystal elements 72 with a pixel size of about 0.2 mm. Also, as described above, as infrared LEDs 62, LEDs with a diameter of about 5 mm are regularly arranged in an approximately lattice form with no gap. In other words, the interval between liquid crystal elements 72 is smaller than that of light emitting elements 62. In this case, by providing of liquid crystal panel 70 between light emitting elements 62 and wafer W, it is possible to control the temperature distribution within a plane of wafer W, with higher precision.

Also, in the present embodiment, in the same manner as the first modified embodiment of the first embodiment, it is possible to obtain the temperature correction value $\Delta T$ within chip CH based on CDAve of measured CDs within chip CH. Also, in the present embodiment, in the same manner as the second modified embodiment of the first embodiment, temperature control may be more minutely performed at the circumferential periphery side of a wafer, compared to that at the center side of the wafer.

Third Embodiment

Hereinafter, a coating/developing system and a coating/developing method according to a third embodiment will be described with reference to FIG. 16.

The coating/developing system and the coating/developing method according to the present embodiment are different from those of the first embodiment, in that the system has an alignment device which aligns chips of an exposed wafer and heating elements to be approximately parallel with each other.

Figure 16:
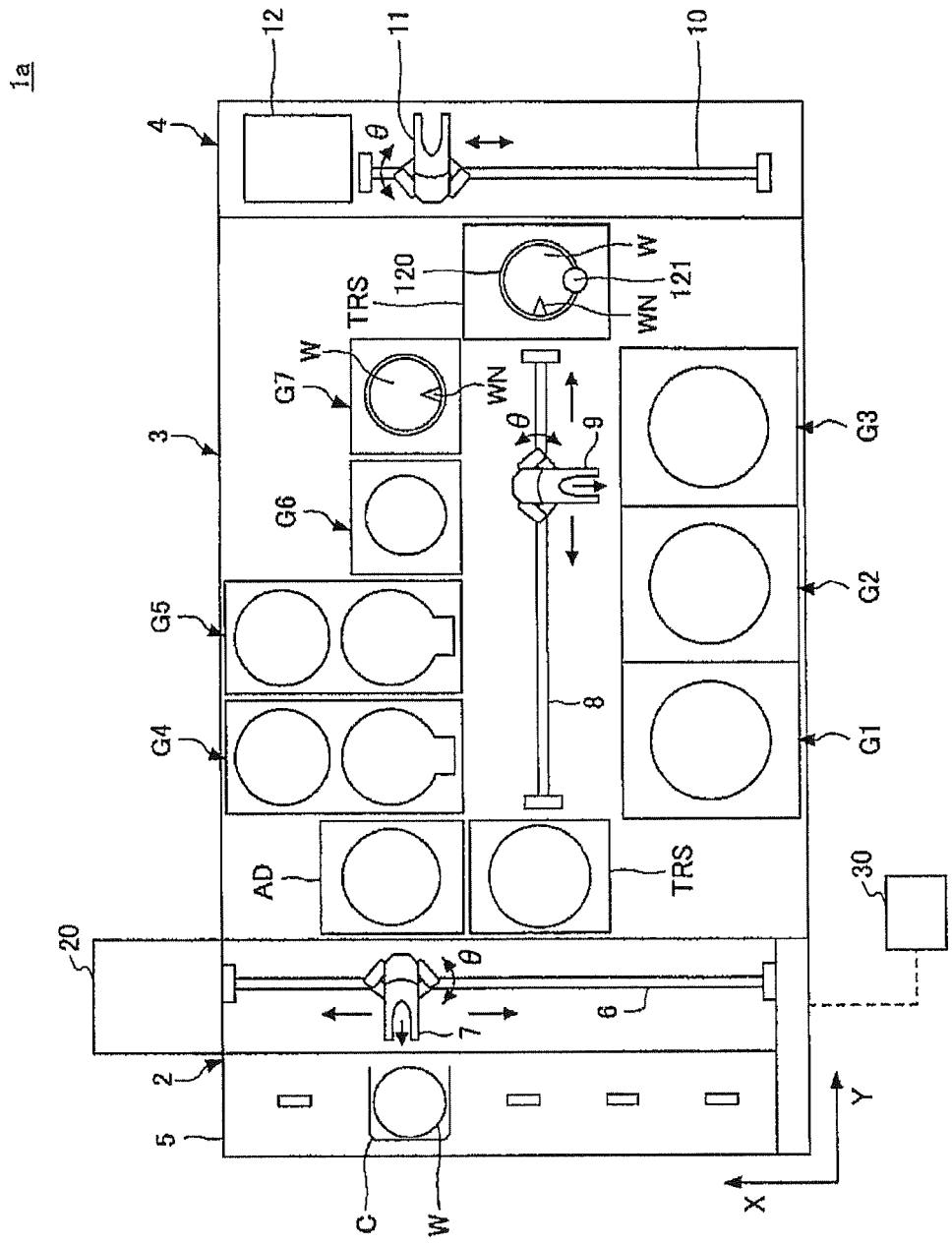
FIG. 16 is a plan view schematically illustrating the configuration of a coating/developing system according to a third embodiment.

FIG. 16 is a plan view schematically illustrating the configuration of a coating/developing system according to the present embodiment.

As shown in FIG. 16, like the first embodiment, a coating/developing system 1 *a* has a configuration in which cassette station 2, processing station 3, and interface station 4 are integratedly connected. Also, cassette station 2 and interface station 4 are the same as those in the first embodiment. Also, processing station 3 including post-exposure baking device PEB is the same as that in the first embodiment, except for transition device TRS as described below.

Meanwhile, transition device TRS provided at interface station 4's side of processing station 3 has a function for performing an alignment process for lining up wafer W. Each wafer W is formed with a cut-out referred to as a so-called orientation flat WF, or a cut-out referred to as a so-called notch WN, as a basis for line-up. Orientation flat WF is formed by cutting a part of the circumferential periphery of wafer W in a straight line. Notch WN is formed by concaving a part of the circumferential periphery of wafer W. Accordingly, the function may be for a notch alignment, in which the line-up is based on a small cut-out (notch) formed in wafer W. Hereinafter, for wafer W having notch WN, an example for notch alignment for line-up of cut-out WN will be described.

Also, transition device TRS according to the present embodiment corresponds to an alignment device of the present disclosure. Also, a line-up process in the present embodiment corresponds to an alignment process of the present disclosure.

As shown in FIG. 16, transition device TRS includes a rotation seating unit 120, and an optical means 121 which is, for example, oppositely disposed in such a manner that it interposes the circumferential periphery of wafer W disposed on rotating seating unit 120 therebetween in an up/down direction. Transition device TRS obtains information on a circumferential periphery shape (profile) of wafer W through optical means 121 by rotating wafer W on rotation seating unit 120. Then, based on the obtained information, it aligns wafer W by obtaining an eccentric amount and an eccentric direction of wafer W from the rotation center of rotation seating unit 120. Next, it newly obtains information on the circumferential periphery shape of wafer W, and from the information, obtains the direction of cut-out WN of wafer W. Then, it aligns the direction of cut-out WN of wafer W with respect to first carrying device 9 by rotating rotation seating unit 120 by a predetermined extent.

In coating/developing system 1*a* as configured above, a coating/developing process of wafer W and a CD measuring process within a plane of wafer W are performed as described below.

First, product wafers Wn (n indicates a natural number of 1 or more) from the inside of cassette C on cassette seating unit 5 are one-by-one taken out by wafer carrier 7 shown in FIG. 1, and carried to an exposure device (not shown) by wafer carrier 11 of interface station 4. Then, wafers are exposed. These processes may be performed in the same manner as the first embodiment.

Meanwhile, wafers Wn which have been subjected the exposure process are transferred to transition device TRS at interface station 4's side by wafer carrier 11. Wafers Wn transferred to transition device TRS are aligned based on cut-out WN (alignment process). Wafers Wn which have been subjected to line-up (alignment process) are carried to post-exposure baking device PEB by first carrying device 9, and are subjected to post-exposure baking.

Next, wafers Wn are carried to high-precision temperature control device CPL, subjected to temperature adjustment, and then returned to cassette C by wafer carrier 7, in the same manner as the first embodiment.

As described above with reference to FIG. 7, chips CH formed on wafer W are generally arranged in a lattice form. In order to reduce a variation of CDs of a resist pattern within a plane of wafer W, it is preferable to align the arrangement direction of chips CH in a lattice form, with the arrangement direction of infrared LEDs 62 in a lattice form (as described above with reference to FIG. 5) to be approximately parallel with each other. However, when wafer W is loaded into post-exposure baking device PEB just after exposure of wafer W, the arrangement direction of chips CH is not parallel with the arrangement direction of infrared LEDs 62.

In the present embodiment, by the alignment function through rotation seating unit 120 and optical means 121 provided in transition device TRS, the direction of cut-out WN of wafer W is aligned. Then, wafer W is loaded into post-exposure baking device PEB, and is subjected to a heating process. Thus, it is possible to align the arrangement direction of chips CH formed in wafer W, with the arrangement direction of infrared LEDs 62 to be approximately parallel with each other, and to further reduce a variation of temperatures among respective chips CH.

Although preferred embodiments of the present disclosure have been described as described above, the present disclosure is not limited to such specific embodiments. Various changes/modification can be made within the scope of the spirit of the present disclosure, as defined in the appended claims.

Also, the heating device according to the present disclosure may be applied to various kinds of devices, such as a film-forming device, an etching device, etc., as well as a coating/developing system. Also, the present disclosure may be applied to a device including a step for carrying various substrates such as a semiconductor device, a glass substrate, etc.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A heating device comprising:
   a heating part including a plurality of two-dimensionally arranged heating elements in a lattice form configured to perform a heating process on an exposed substrate prior to a developing process to form a resist pattern on the exposed substrate using a resist film;
   a seating part provided at an upper side of the heating part and configured to place the exposed substrate; and
   a control part configured to correct a setting temperature of the heating part based on a temperature correction value, and to control the heating part based on the corrected setting temperature, during a heating process of the exposed substrate by the heating part,
   wherein the temperature correction value is obtained in advance from a measured line width of a resist pattern formed on a substrate separately processed from the exposed substrate through a heating process by the heating part and a subsequent developing process, and
   the control part is configured to control each of the plurality of two-dimensionally arranged heating elements individually based on the corrected setting temperature.

2. The heating device as claimed in claim 1, wherein the heating elements are light emitting devices emitting infrared rays.

3. The heating device as claimed in claim 2, wherein the light emitting devices are light emitting diodes.

4. The heating device as claimed in claim 2, wherein the heating part includes a plurality of liquid crystal devices arranged two dimensionally between the plurality of light emitting devices and the exposed substrate to transmit or block the infrared rays emitted from the light emitting devices, and the control part controls a transmission ratio of the infrared rays at each of the liquid crystal devices during the heating process on the exposed substrate.

5. The heating device as claimed in claim 1, wherein the seating part includes a plurality of protrusions provided at an upper side of the heating part, the protrusions being configured to separately support the exposed substrate while keeping the exposed substrate with a predetermined distance from the upper side of the heating part.

6. The heating device as claimed in claim 5, further comprising a temperature sensor, provided in the plurality of protrusions configured to measure a temperature of the exposed substrate.

7. The heating device as claimed in claim 1, further comprising a cooling part, provided at a lower side of the heating part, configured to cool the exposed substrate or the heating part.

8. The heating device as claimed in claim 1, wherein a plurality of chips are arranged on the exposed substrate, and an arrangement interval of the plurality of heating elements is smaller than an arrangement interval of the plurality of chips.

9. A coating and developing system comprising:
   a coating device configured to coat a resist film on a substrate;
   an exposure device configured to expose the substrate coated with the resist film;
   a developing device configured to develop the resist film on the substrate to form a resist pattern after exposing the resist film;
   a heating device as claimed in claim 1; and
   a line width measuring device configured to measure the line width of the resist pattern formed on the substrate separately processed in advance from the exposed substrate.

10. The coating and developing system as claimed in claim 9, wherein a plurality of chips are arranged on the exposed substrate, and the coating and developing system further comprises an alignment device, configured to align the exposed substrate in such a manner that an arrangement direction of the plurality of chips, and an arrangement direction of the plurality of heating elements are approximately parallel with each other during disposition of the exposed substrate on the seating part.

11. A heating method comprising:
   coating a resist film on a substrate;
   exposing the resist film on the substrate;
   heating the exposed substrate with a heating device which includes a heating part having a plurality of two-dimensionally arranged heating elements in a lattice form, a seating part provided at an upper side of the heating part and configured to place the exposed substrate, and a control part configured to correct a setting temperature of the heating part;
   correcting the setting temperature of the heating part based on a temperature correction value, and controlling the heating part based on the corrected setting temperature; and
   developing the resist film on the substrate heated at the heating step,
   wherein the temperature correction value is obtained in advance from measured line width of a resist pattern formed on a substrate separately processed from the exposed substrate through a heating process by the heating part and a subsequent developing process, and
   the control part is configured to control each of the plurality of two-dimensionally arranged heating elements individually based on the corrected setting temperature.

12. The heating method as claimed in claim 11, wherein the heating elements are light emitting devices emitting infrared rays, and the controlling step controls an amount of light arriving at the exposed substrate from each of the light emitting devices.

13. The heating method as claimed in claim 12, wherein the light emitting devices are light emitting diodes.

14. The heating method as claimed in claim 12, wherein the heating part includes a plurality of liquid crystal devices arranged two dimensionally between the plurality of light emitting devices and the exposed substrate to transmit or block the infrared rays emitted from the light emitting devices, and the controlling steps controls a transmission ratio of the infrared rays at each of the liquid crystal devices.

15. The heating method as claimed in claim 11, wherein the seating part includes a plurality of protrusions provided at an upper side of the heating part, the protrusions being configured to separately support the exposed substrate while keeping the exposed substrate with a predetermined distance from the upper side of the heating part.

16. The heating method as claimed in claim 15, wherein the heating device further includes a temperature sensor, provided in the plurality of protrusions configured to measure a temperature of the exposed substrate.

17. The heating method as claimed in claim 11, wherein the heating device further includes a cooling part provided at a lower side of the heating part configured to cool the exposed substrate or the heating part.

18. The heating method as claimed in claim 11, wherein a plurality of chips are arranged on the exposed substrate, and the controlling step controls an arrangement interval of the plurality of heating elements to be smaller than an arrangement interval of the plurality of chips.

19. A coating and developing method to coat resist on a substrate, to form a resist film on the substrate coated with the resist through a heating process, and to form a resist pattern on the substrate formed with the resist film by exposure and then a developing process, the coating/developing method comprising:

heating an exposed substrate according to the heating method as claimed in claim 11; and measuring the line width of the resist pattern formed on the substrate separately processed in advance from the exposed substrate.

20. The coating and developing method as claimed in claim 19, wherein a plurality of chips are arranged on the exposed substrate, and the coating/developing method further comprises aligning the exposed substrate in such a manner that an arrangement direction of the plurality of chips, and an arrangement direction of the plurality of heating elements are approximately parallel with each other during disposition of the exposed substrate on the seating part.

21. A computer-readable recording medium storing a computer executable program that, when executed, causes a computer to perform the heating method as claimed in claim 11.

22. A computer-readable recording medium storing a computer executable program that, when executed, causes a computer to perform the coating and developing method as claimed in claim 19.

* * * * *